(12) United States Patent
Kim et al.

(10) Patent No.: US 11,676,820 B2
(45) Date of Patent: *Jun. 13, 2023

(54) SEMICONDUCTOR DEVICE AND METHOD FOR FABRICATING THE SAME

(71) Applicant: SK hynix Inc., Gyeonggi-do (KR)

(72) Inventors: Oh-Hyun Kim, Gyeonggi-do (KR); Sung-Hwan Ahn, Gyeonggi-do (KR); Hae-Jung Park, Seoul (KR); Tae-Hang Ahn, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 336 days.

This patent is subject to a terminal disclaimer.

(21) Appl. No.: 17/012,851

(22) Filed: Sep. 4, 2020

(65) Prior Publication Data

US 2020/0402804 A1 Dec. 24, 2020

Related U.S. Application Data

(63) Continuation of application No. 16/682,725, filed on Nov. 13, 2019, now Pat. No. 10,790,150, which is a
(Continued)

(30) Foreign Application Priority Data

Jun. 1, 2017 (KR) .................. 10-2017-0068636

(51) Int. Cl.
*H01L 21/285* (2006.01)
*H10B 12/00* (2023.01)
(Continued)

(52) U.S. Cl.
CPC .. *H01L 21/28562* (2013.01); *H01L 21/28525* (2013.01); *H01L 21/76805* (2013.01);
(Continued)

(58) Field of Classification Search
CPC ......... H01L 27/10855; H01L 21/76879; H01L 21/76805; H01L 27/10888;
(Continued)

(56) References Cited

U.S. PATENT DOCUMENTS

| 10,790,150 B2 * | 9/2020 | Kim ................. H01L 21/76805 |
| 2009/0004855 A1 * | 1/2009 | Lee .................. H01L 27/10876 438/669 |
| 2012/0156869 A1 * | 6/2012 | Shin ..................... H01L 29/4236 438/589 |

FOREIGN PATENT DOCUMENTS

| KR | 10-2003-0006542 A | 1/2003 |
| KR | 10-2008-0102065 A | 11/2008 |

(Continued)

OTHER PUBLICATIONS

Office Action issued by the Korean Intellectual Property Office dated Jul. 6, 2021.

*Primary Examiner* — Alia Sabur

(74) *Attorney, Agent, or Firm* — IP & T Group LLP

(57) ABSTRACT

A method for fabricating a semiconductor device includes: preparing a substrate; forming an isolation layer defining an active region in the substrate; forming a first insulation structure over the substrate, the first insulation structure defining a line-type opening that exposes the isolation layer and the active region; forming a plug pad through a Selective Epitaxial Growth (SEG) process over the exposed active regions; forming a second insulation structure inside the line-type opening, the second insulation structure defining a contact hole landing on the plug pad; and filling the contact hole with a contact plug.

9 Claims, 26 Drawing Sheets

Related U.S. Application Data continuation of application No. 15/837,530, filed on Dec. 11, 2017, now Pat. No. 10,522,362.

(51) Int. Cl.
*H01L 21/768* (2006.01)
*H01L 27/108* (2006.01)

(52) U.S. Cl.
CPC .. *H01L 21/76831* (2013.01); *H01L 21/76832* (2013.01); *H01L 21/76879* (2013.01); *H01L 21/76883* (2013.01); *H01L 21/76897* (2013.01); *H01L 27/10814* (2013.01); *H01L 27/10855* (2013.01); *H01L 27/10885* (2013.01); *H01L 27/10888* (2013.01); *H01L 27/10826* (2013.01)

(58) Field of Classification Search
CPC ......... H01L 21/28525; H01L 29/42356–4236; H01L 27/10876
See application file for complete search history.

(56) References Cited

FOREIGN PATENT DOCUMENTS

| | | |
|---|---|---|
| KR | 10-0869351 B1 | 11/2008 |
| KR | 10-2012-0066829 A | 6/2012 |

\* cited by examiner

SEMICONDUCTOR DEVICE AND METHOD FOR FABRICATING THE SAME

CROSS-REFERENCE TO RELATED APPLICATIONS

This application is a continuation of U.S. patent application Ser. No. 16/682,725 filed on Nov. 13, 2019, which is a continuation of U.S. patent application Ser. No. 15/837,530 filed on Dec. 11, 2017 and issued as U.S. Pat. No. 10,522, 362 on Dec. 31, 2019 which claims benefits of priority of Korean Patent Application No. 10-2017-0068636 filed on Jun. 1, 2017. The disclosure of each of the foregoing application is incorporated herein by reference in its entirety.

BACKGROUND

1. Field

Exemplary embodiments of the present invention relate to a semiconductor device, and more particularly, to a semiconductor device including a contact plug, and a method for fabricating the semiconductor device.

2. Description of the Related Art

As the degree of integration of semiconductor devices becomes higher and higher and the size of the semiconductor devices is miniaturized, the sizes of contact plugs are required to shrink. The shrinking contact plugs may increase the aspect ratios of contact holes.

However, when an etch process is performed to form a contact hole of a high aspect ratio, such problems as misalignment of the contact hole and the contact hole not being opened may occur.

The deformation in the contact hole of a high aspect ratio may make it difficult to form a contact plug and deteriorate the electrical characteristics of a semiconductor device.

SUMMARY

Embodiments of the present invention are directed to a semiconductor device capable of providing excellent electrical characteristics and a method for fabricating the semiconductor device.

In accordance with an embodiment of the present invention, a method for fabricating a semiconductor device includes: preparing a substrate; forming an isolation layer defining an active region in the substrate; forming a first insulation structure over the substrate, the first insulation structure defining a line-type opening that exposes the isolation layer and the active region; forming a plug pad through a Selective Epitaxial Growth (SEG) process over the exposed active regions; forming a second insulation structure inside the line-type opening, the second insulation structure defining a contact hole landing on the plug pad; and filling the contact hole with a contact plug. A bottom surface of the contact hole may be formed to be smaller than a surface area of an upper portion of the plug pad. The plug pad may include a central portion that is formed in the exposed active region, and a side extended portion that laterally grows up from the central portion. The plug pad may include a silicon-containing epitaxial layer. The plug pad may include a SEG-Si, SEG-SiP, SEG-SiGe, or SEG-SiC. The SEG process may be performed by using silane ($SiH_4$), dichlorosilane ($SiH_2Cl_2$, DCS), and hydrogen chloride (HCl) at a low temperature ranging from approximately 550° C. to approximately 650° C. The forming of the plug pad may include: forming a silicon epitaxial layer through the SEG process; and exposing the silicon epitaxial layer to an annealing process in an ambient of hydrogen. The forming of the first insulation structure may include: forming a first insulating material over the substrate; forming a plurality of first insulating layers by etching the first insulating material; forming a first spacer on both side walls of each of the first insulation layers; and forming a recess by etching the substrate to be self-aligned to the first spacer. The forming of the second insulation structure may include: forming a second spacer over the plug pad and the first insulation structure; forming a second insulation layer that fills the line-type opening over the second spacer; and forming the contact hole by etching the second insulation layer and the second spacer to expose the plug pad. The contact plug may include polysilicon, a metal, a metal nitride, or a combination thereof.

In accordance with another embodiment of the present invention, a method for fabricating a semiconductor device includes: forming an isolation layer that defines a plurality of active regions in a substrate; forming a plurality of bit lines over the substrate; forming a line-type opening that is in parallel with the bit lines and exposes at least the active regions between the bit lines; forming a recess by etching the exposed active regions; performing a Selective Epitaxial Growth (SEG) process to form a plug pad that contacts the active regions inside the recess; forming a plug isolation structure where a contact hole landing on the plug pad is defined over the plug pad; and filling the contact hole with a contact plug. A cross-section of a bottom surface of the contact hole is formed to be smaller than a cross-section of a surface area of an upper portion of the plug pad. The plug pad may include a central portion formed on the exposed at least one active region, and a side extended portion that laterally grows from the central portion to extend over the isolation layer. The plug pad may include a silicon-containing epitaxial layer. The plug pad may include a SEG-Si, SEG-SiP, SEG-SiGe, or SEG-SiC. The SEG process may be performed by using silane ($SiH_4$), dichlorosilane ($SiH_2Cl_2$, DCS), and hydrogen chloride (HCl) at a low temperature ranging from approximately 550° C. to approximately 650° C. The performing a Selective Epitaxial Growth (SEG) process may include forming a silicon epitaxial layer through the SEG process; and exposing the silicon epitaxial layer to an annealing process in an ambient of hydrogen. The forming of the plug isolation structure may include forming a spacer over the plug pad and the line-type opening; forming a sacrificial layer that fills the line-type opening over the spacer; forming a plug isolation portion by etching the sacrificial layer; filling the plug isolation portion with a plug isolation layer; forming a contact hole by removing the sacrificial layer; and extending the contact hole by etching the spacer to expose the plug pad. The method may further include forming a memory element over the contact plug, after the filling the contact hole with a contact plug. The contact plug may include polysilicon, a metal, a metal nitride, or a combination thereof.

In accordance with yet another embodiment of the present invention, a semiconductor device may include a semiconductor substrate including an active region and an isolation layer; a plurality of bit lines over the semiconductor substrate; a line-type opening that may be formed between the bit lines and includes a recess which exposes the active region and the isolation layer; a plug pad that may be formed inside the recess and contacts the active region; a plug isolation structure that may be formed inside the line-type opening to expose the plug pad and defines a contact hole having a smaller landing area than a surface area of an upper portion of the plug pad; and a contact plug that may be formed inside the contact hole. The plug pad may include a central portion that may be formed in the active region, and a side extended portion that laterally grows up from the central portion. The plug pad may include an epitaxial layer. The plug pad may include a SEG-Si or SEG-SiP. The plug isolation structure may include a spacer that may be formed on both side walls of the line-type opening; and a plug isolation layer that may be formed inside the line-type opening where the spacer may be formed, and the contact hole may be defined by being self-aligned to the plug isolation layer and the spacer. The semiconductor device may further include a word line that may be buried in the semiconductor substrate; first and second source/drain regions that may be formed in the semiconductor substrate on both sides of the word line; a bit line contact plug that may be formed over the first source/drain region; and a bit line over the bit line contact plug, wherein the plug pad may be coupled to the second source/drain region. The semiconductor device may further include a memory element that may be formed over the contact plug.

DETAILED DESCRIPTION

Figure 1A:
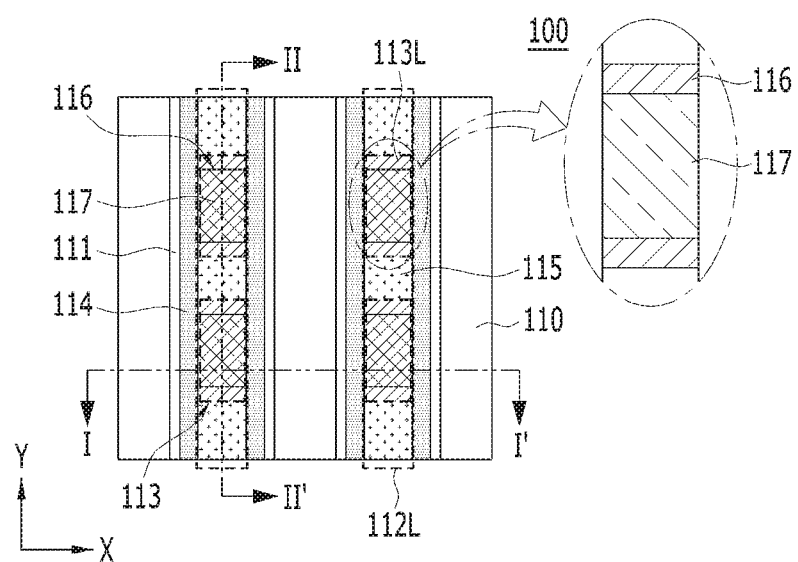
FIG. 1A is a plan view of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following embodiments, a pattern of a high aspect ratio may include an opening, a contact hole, a trench, a source/drain recess. The high aspect ratio may have a height-to-width ratio that is greater than approximately 1:1. The pattern of a high aspect ratio may be filled with a contact plug. The lower portion of the high aspect ratio pattern may be filled with a plug pad. In other words, a contact plug may be formed over the plug pad. The plug pad may also be called a contact pad or a landing pad.

The plug pad may be formed with an epitaxial layer through a bottom-up growth process. The bottom-up growth process may include a Selective Epitaxial Growth (SEG) process. In an embodiment the plug pad may be formed before the contact hole is formed.

Figure 1B:
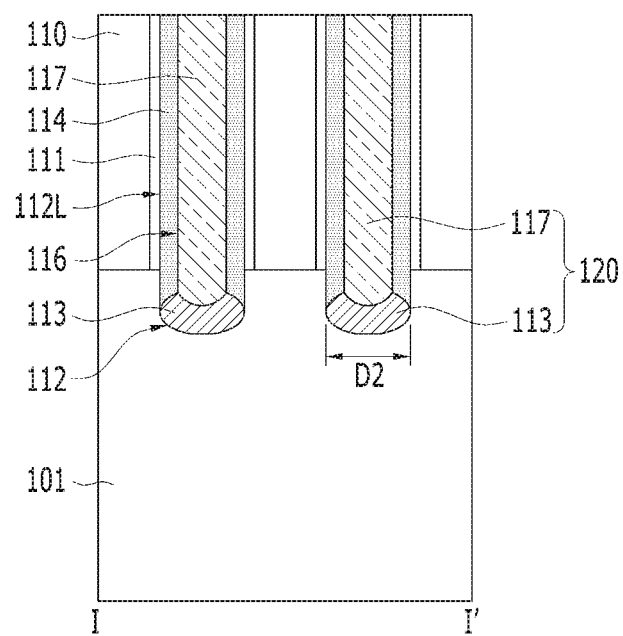
FIG. 1B is a cross-sectional view of the semiconductor device of FIG. 1A taken along a line I-I'.
Figure 1C:
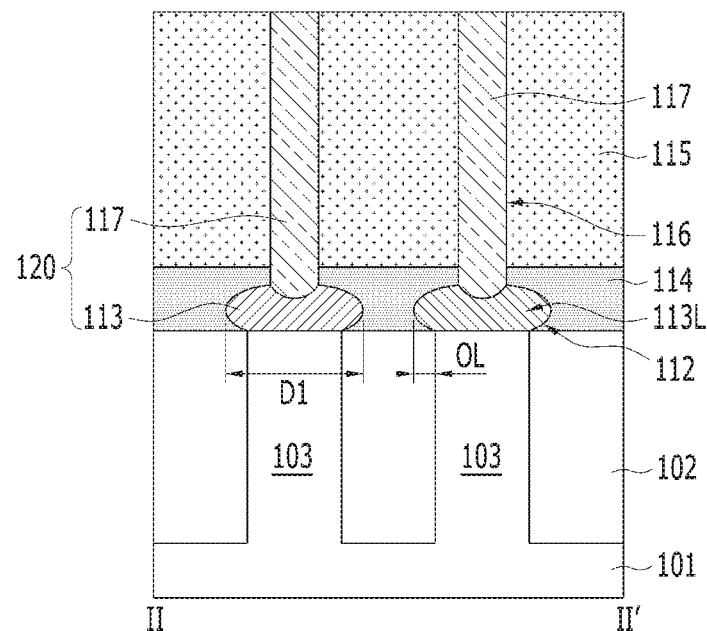
FIG. 1C is a cross-sectional view of the semiconductor device of FIG. 1A taken along a line II-II'.

FIG. 1A is a plan view of a semiconductor device in accordance with an embodiment of the present invention. FIG. 1B is a cross-sectional view of the semiconductor device of FIG. 1A taken along a line I-I'. FIG. 1C is a cross-sectional view of the semiconductor device of FIG. 1A taken along a line II-II'.

Referring to FIGS. 1A to 1C, the semiconductor device 100 may include a contact structure 120.

A first insulation layer 110 and a second insulation layer 115 may be formed over a substrate 101. The first insulation layer 110 and the second insulation layer 115 may provide a high aspect ratio pattern, which is a contact hole 116. A recess 112 may be formed in the inside of the substrate 101 below the contact hole 116. A plug pad 113 may be formed inside the recess 112. A contact plug 117 may be formed inside the contact hole 116. The contact structure 120 may include the plug pad 113 and the contact plug 117. The plug pad 113 may contact an active region 103 of the substrate 101, and the contact plug 117 may be formed over the plug pad 113.

The substrate 101 may include a material that is suitable for semiconductor processing. The substrate 101 may include a semiconductor substrate. For example, the substrate 101 may include a silicon substrate, a silicon germanium (SiGe) substrate, or a Silicon On Insulator (SOI) substrate. The substrate 101 may include a plurality of active regions 103 that are defined by an isolation layer 102.

The first insulation layer 110 and the second insulation layer 115 may include an oxide, a nitride, a low-k material, or a combination thereof. For example, the first insulation layer 110 and the second insulation layer 115 may include a silicon dioxide ($SiO_2$), TEOS (Tetra Ethyl Ortho Silicate), PSG (phosphosilicate glass), BPSG (boro-phosphosilicate glass), BSG (boro-silicate glass), SOD (Spin-On-Dielectric), a silicon nitride ($Si_3N_4$), or a combination thereof. The first insulation layer 110 may be a single layer or multiple layers. A plurality of the second insulation layers 115 may be disposed between the first insulation layers 110. The contact hole 116 may be defined between the second insulation layers 115.

A first spacer 111 may be formed on both side walls of the first insulation layer 110. A second spacer 114 may be formed on a side wall of the first spacer 111. The first spacer 111 and the second spacer 114 may include the same material. For example, the first spacer 111 and the second spacer 114 may be formed of a silicon nitride, individually. The first spacer 111 may have a structure that covers a semiconductor structure (not shown). The semiconductor structure may include a gate electrode of a transistor. The first insulation layer 110 may have a shape of a line that is extended in one direction, e.g., a Y direction. The first insulation layer 110 and the first spacer 111 may be collectively called 'a first insulation structure'. A line-type opening 112L may be defined by the first insulation layer 110 and the first spacer 111. The first insulation layer 110, the first spacer 111, and the line-type opening 112L may be extended in one direction, e.g., a Y direction. The second insulation layer 115 and the second spacer 114 may be collectively called 'a second insulation structure'. The second spacer 114 may be formed on a side wall of the line-type opening 112L. The second insulation layer 115 may be formed in the inside of the line-type opening 112L where the second spacer 114 is formed.

The lower portion of the second spacer 114 may be extended to a side wall of the recess 112. The lower portion of the second spacer 114 may contact the surface of the upper surface of the plug pad 113. The first spacer 111 may not contact the plug pad 113. The first spacer 111 and the second spacer 114 may have a line shape. The first spacer 111 and the second spacer 114 may be in parallel to a side wall of the first insulation layer 110.

The recess 112 may refer to a lower portion area of the line-type opening 112L. The bottom surface of the recess 112 may be positioned at a lower level than an upper surface of the substrate 101. The contact hole 116 may have a line width that is shorter than the line widths of the line-type opening 112L and the recess 112. The contact holes 116 may be formed independently to individually expose the active regions 103. From the perspective of a top view, the contact hole 116 may have a rectangular shape. The contact hole 116 may be formed to be self-aligned to the side walls of the second spacer 114 and the second insulation layer 115.

The bottom surface of the line-type opening 112L, which is the recess 112, may be extended into the inside of the substrate 101. The recess 112 may be filled with the plug pad 113. The plug pad 113 may fill a portion of the recess 112.

The plug pad 113 may be formed through a bottom-up growth process. The bottom-up growth process may include an epitaxial growth process. The epitaxial growth process may include a selective epitaxial growth process. The plug pad 113 may include a silicon-containing epitaxial layer. For example, the plug pad 113 may include a silicon epitaxial layer. Since the plug pad 113 may be formed through the selective epitaxial growth (SEG) process, the plug pad 113 may include a selectively epitaxially grown silicon (SEG-Si).

The plug pad 113 may include a dopant. Therefore, the plug pad 113 may be a doped epitaxial layer. The dopant may include an N-type dopant. Non-limiting examples of the N-type dopant may include phosphorus (P), arsenic (As), antimony (Sb), or a combination thereof. The plug pad 113 may include a phosphorus-doped silicon epitaxial layer through the selective epitaxial growth (SEG) process, that is, the plug pad 113 may include an SEG-SiP. The plug pad 113 may include a lightly doped SEG-SiP, a heavily doped SEG-SiP, or a combination thereof. Herein, in the terms "lightly doped SEG-SiP" and "heavily doped SEG-SiP", "lightly doped" and "heavily doped" may refer to the concentration of phosphorus (P).

According to an embodiment of the present invention, the plug pad 113 may include SEG-SiGe doped with an N-type dopant or SEG-SiC doped with an N-type dopant.

The contact plug 117 may be formed over the plug pad 113. The contact plug 117 may fill the contact hole 116. The bottom surface of the contact hole 116 may be extended into the inside of the plug pad 113. In other words, the bottom surface of the contact hole 116 may include a recessed bottom surface that is extended into the plug pad 113. As a result, the contact area between the plug pad 113 and the contact plug 117 may be increased. The contact plug 117 may include a silicon-containing material, a metal-containing material, or a combination thereof.

The plug pad 113 may fill the recess 112, and the contact plug 117 may fill the contact hole 116. The plug pad 113 may be shorter than the contact plug 117 in terms of their respective height.

The plug pad 113 may include a side extended portion 113L. The side extended portion 113L may overlap with the isolation layer 102. As a result, a line width D2 in a second direction (X direction) of the plug pad 113 may be shorter than a line width D1 in a first direction (Y direction) of the plug pad 113. Therefore, a sufficiently large landing area may be obtained for the contact plug 117.

An overlay margin with the contact plug 117 may be obtained due to the presence of the side extended portion 113L of the plug pad 113.

FIGS. 2A to 2G are cross-sectional views illustrating an example of a method for fabricating the semiconductor device in accordance with the first embodiment of the present invention.

Figure 2A:
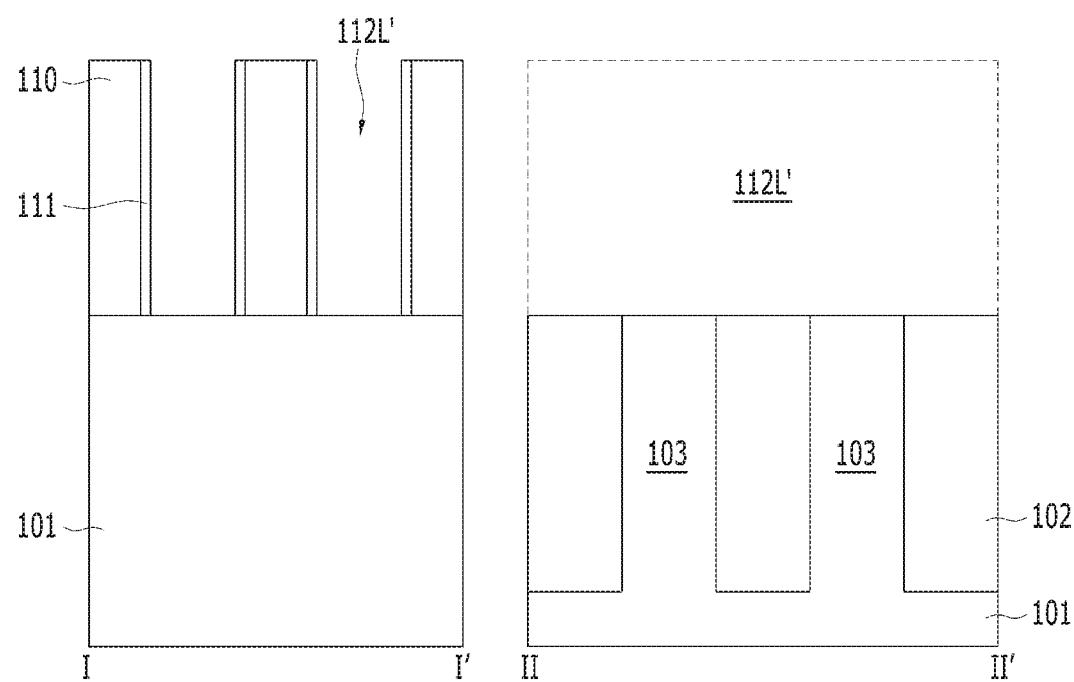
FIGS. 2A to 2G are cross-sectional views illustrating an example of a method for fabricating the semiconductor device in accordance with an embodiment of the present invention.

Referring to FIG. 2A, the substrate 101 may be prepared. The substrate 101 may include the isolation layer 102 and the active region 103. Although not illustrated, impurity regions may be formed on the surface of the active region 103. The impurity regions may be source/drain regions of a transistor. A plurality of active regions 103 may be defined by the isolation layer 102.

A plurality of first insulation layers 110 may be formed over the substrate 101. The first insulation layers 110 may be formed of a silicon nitride. From the perspective of a top view, each of the first insulation layers 110 may have a linear shape of a line that is extended in one direction, e.g. the Y direction. The line-shaped first insulation layer 110 may be formed by depositing a first insulating material and etching the first insulating material through a photolithography process and an etch process. Although not illustrated, a semiconductor material capped with the first insulation layer 110 may be formed over the substrate 101.

First spacers 111 may be formed on both side walls of each of the first insulation layers 110. Each of the first spacers 111 may have a shape of a line extending in the Y direction in parallel to a side wall of the first insulation layer 110. The first spacer 111 may be formed of a silicon nitride.

A plurality of line-type openings 112L' may be defined by the first spacers 111 and the first insulation layers 110. The surface of the substrate 101 under the line-type openings 112L' may be exposed. The line-type opening 112L' may simultaneously expose the active region 103 and the isolation layer 102.

Figure 2B:
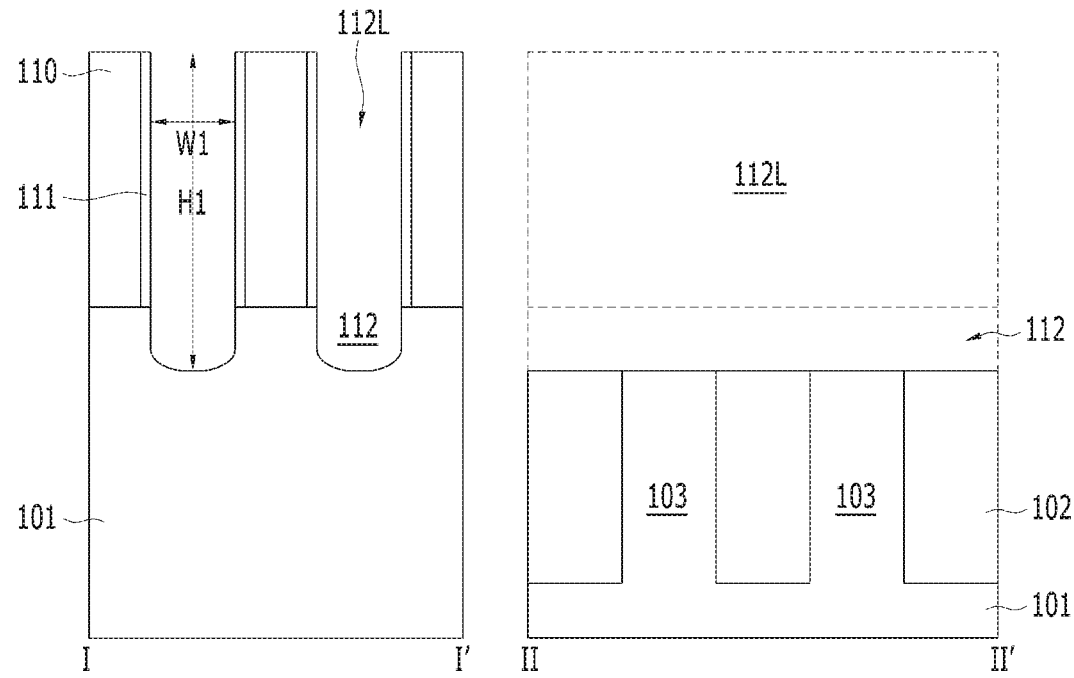

Referring to FIG. 2B, the recess 112 may be formed in the substrate 101. The recess 112 may be formed by using the first insulation layer 110 and the first spacer 111 as an etch barrier and etching the surface of the substrate 101. From the perspective of a top view, the recess 112 may have a line shape which is the same as the line-type opening 112L'.

The line-type opening 112L may be formed by forming the recess 112. In other words, the lower portion of the line-type opening 112L may be defined by the recess 112, and the recess 112 may make the lower portion of the line-type opening 112L extended into the inside of the substrate 101.

The line-type opening 112L may have a first aspect ratio AR1. The first aspect ratio AR1 may be a high aspect ratio that is higher than at least approximately 10:1. The aspect ratio refers to a ratio of the height (H) over the width (W) of the line-type opening 112L. The line-type opening 112L may have a first width W1 and a first height H1.

Figure 2C:
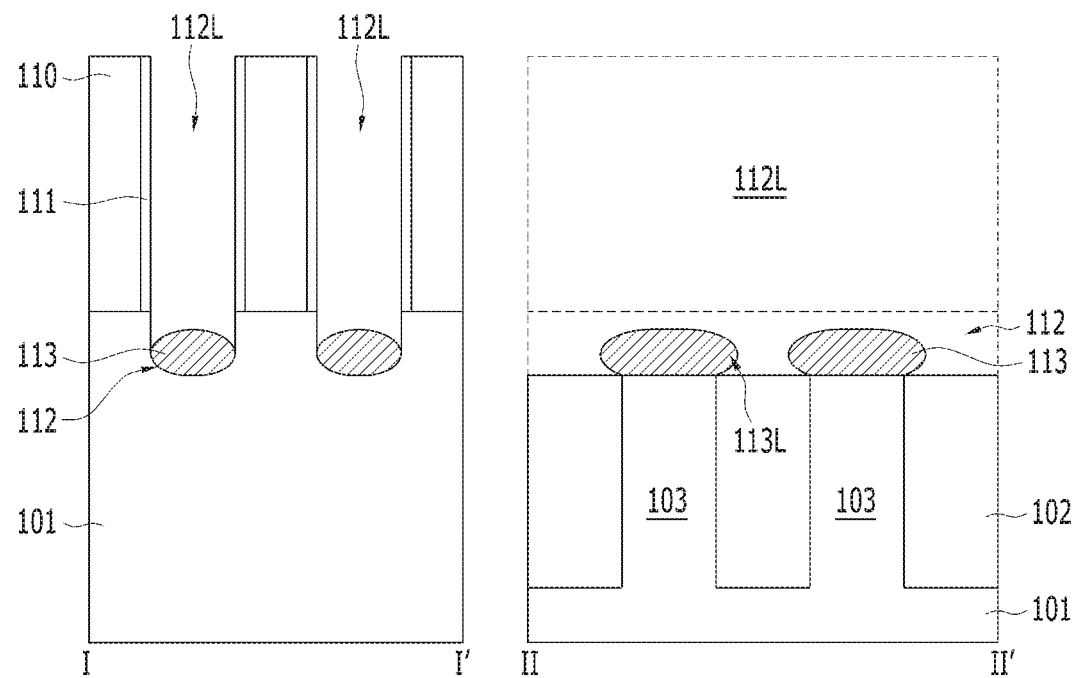

Referring to FIG. 2C, the plug pad 113 may be formed in the inside of the recess 112. The plug pad 113 may fill a portion of the recess 112. The plug pad 113 may be formed through a bottom-up growth process. The plug pad 113 may be formed through a selective epitaxial growth (SEG) process. The plug pad 113 may be formed by taking the substrate 101 as a seed. The plug pad 113 may include a silicon-containing material. The plug pad 113 may be an epitaxial layer. The plug pad 113 may be a silicon-containing epitaxial layer. The plug pad 113 may include SEG-Si, SEG-SiGe, or SEG-SiC. According to another embodiment of the present invention, the plug pad 113 may include SEG-Si doped with an N-type dopant, SEG-SiGe doped with an N-type dopant, or SEG-SiC doped with an N-type dopant. For example, the plug pad 113 may be formed of SEG-SiP.

The upper surface of the plug pad 113 may be positioned at a lower level than the upper surface of the substrate 101.

As described above, since the selective epitaxial growth process is performed to form the plug pad 113, the fabrication process may be simplified. Also, the inside of the recess 112 may be filled with the plug pad 113 without voids.

The plug pad 113 may include the side extended portion 113L. The side extended portion 113L may have a lateral growth thickness that may overlap with the isolation layer 102.

Figure 2D:
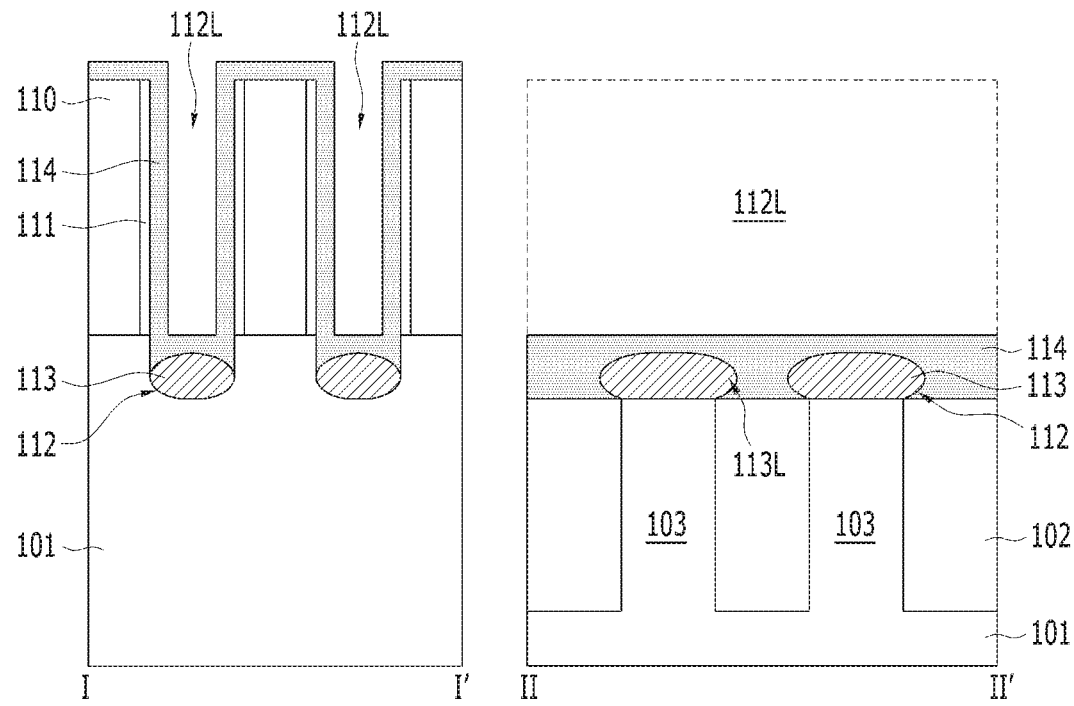

Referring to FIG. 2D, the second spacer 114 may be formed to cover the plug pad 113 and the first spacer 111. The second spacer 114 may be formed of an insulating material such as a silicon oxide or a silicon nitride or combinations thereof. The first spacer 111 and the second spacer 114 may be formed of the same material. The second spacer 114 may be thicker than the first spacer 111.

Figure 2E:
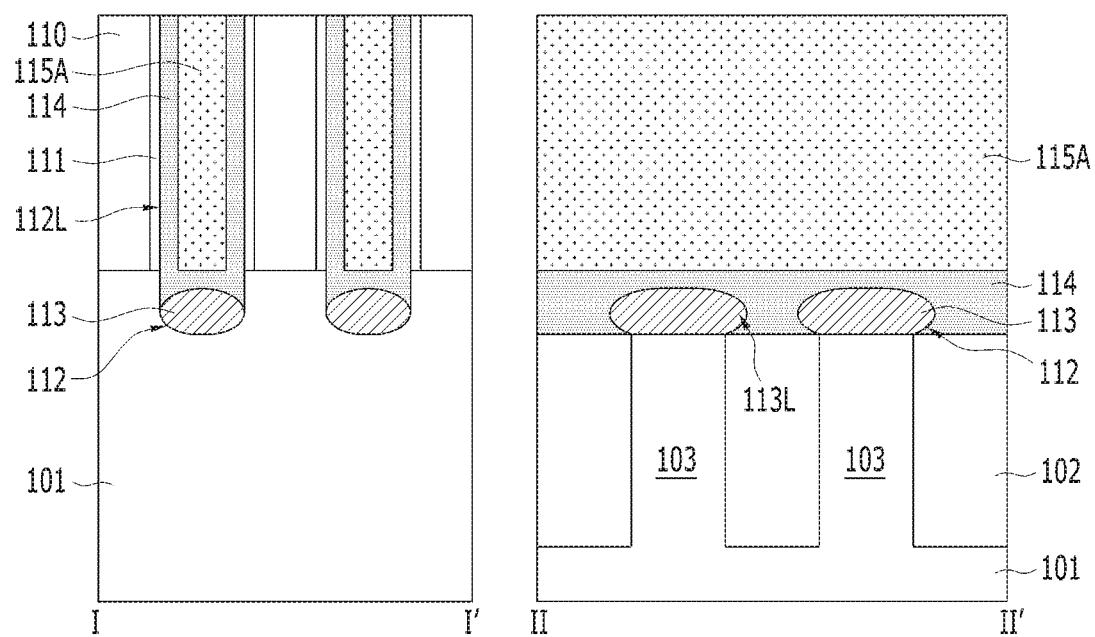

Referring to FIG. 2E, the second insulation layer 115A may be formed. The second insulation layer 115A may fill the line-type opening 112L over the second spacer 114.

The second insulation layer 115A be formed of an insulating material such as a silicon oxide or a silicon nitride or combinations thereof. Subsequently, the second insulation layer 115A may be planarizied to expose the upper portion of the first insulation layer 110. As a result, the second insulation layer 115A may be positioned between the first insulation layers 110. From the perspective of a top view, the second insulation layer 115A may be in parallel to the first insulation layer 110.

Figure 2F:
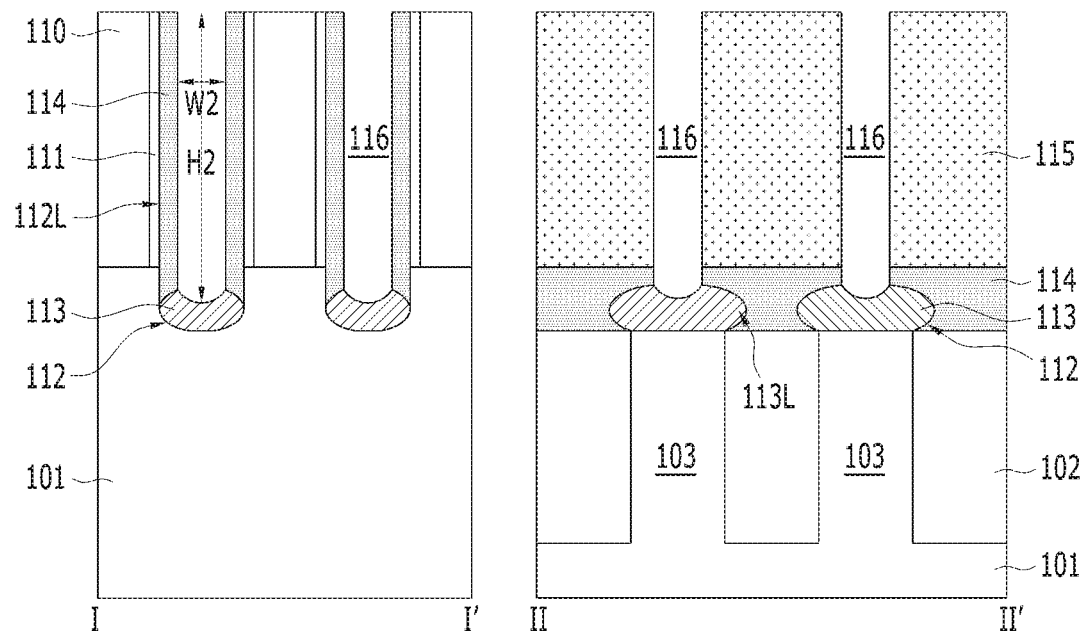

Referring to FIG. 2F, the contact hole 116 may be formed. The contact hole 116 may be formed by selectively removing a portion of the second insulation layer 115A. Therefore, the contact hole 116 may be positioned between the remaining second insulation layers 115. The contact hole 116 may have a rectangular shape when it is looked from the top. The contact hole 116 may be formed to be self-aligned to the second spacer 114 and the second insulation layer 115.

A portion of the second spacer 114 may be exposed under the contact hole 116. Subsequently, the lower portion of the contact hole 116 may be extended. In other words, the second spacer 114 below the contact hole 116 may be etched. As a result, the plug pad 113 may be exposed in the bottom surface of the contact hole 116. When the second spacer 114 is etched, the upper surface of the plug pad 113 may be recessed to a predetermined depth.

The contact hole 116 may have a second aspect ratio AR2. The contact hole 116 may have a second width W2 and a second height H2. The second aspect ratio AR2 may be smaller than the first aspect ratio AR1 of the line-type opening 120L. The contact hole 116 may have the second aspect ratio AR2 that is smaller than the first aspect ratio AR1 due to the plug pad 113. Due to the presence of the side extended portion 113L of the plug pad 113, the landing area of the contact hole 116 may be sufficiently obtained.

Figure 2G:
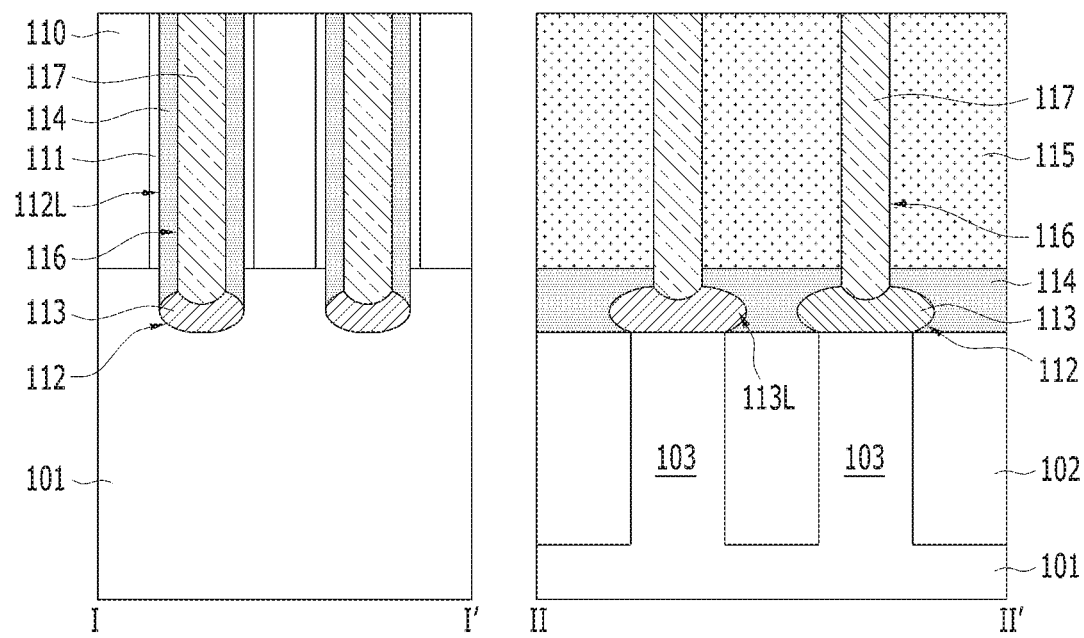

Referring to FIG. 2G, the inside of the contact hole 116 may be filled with the contact plug 117. The contact plug 117 may contact the plug pad 113. The contact plug 117 may be a layer of a silicon-containing material or a metal material, or a stacked layer thereof.

As described above, since the plug pad 113 is formed before the formation of the contact hole 116 in the first embodiment of the present invention, the aspect ratio of the contact hole 116 may be decreased. As a result, the contact hole 116 may be filled with the contact plug 117 without voids. Also, it is possible to prevent a not-open phenomenon of the contact hole 116.

Also, since the plug pad 113 is formed before the formation of the contact hole 116, an improved overlay margin of the contact hole 116 may be obtained.

Figure 3A:
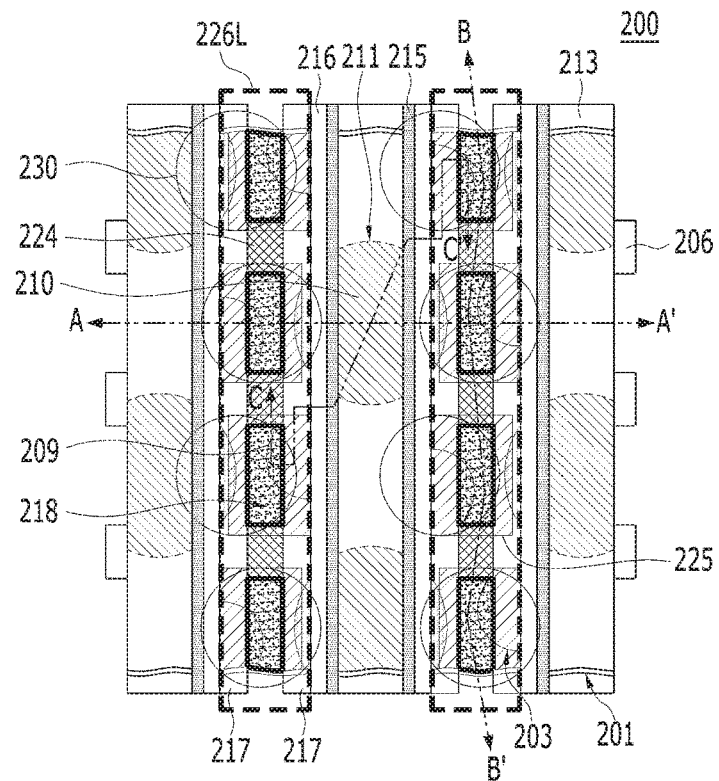
FIG. 3A is a plan view of a semiconductor device in accordance with an embodiment of the present invention.
Figure 3B:
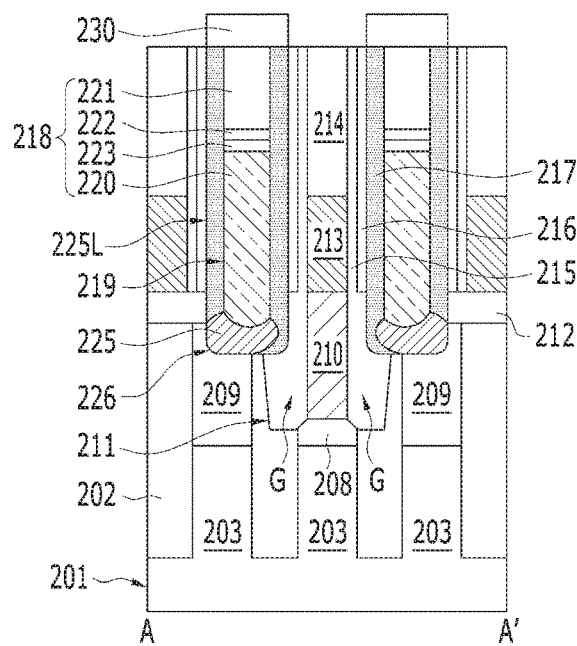
FIG. 3B is a cross-sectional view of the semiconductor device of FIG. 3A taken along a line A-A'.
Figure 3C:
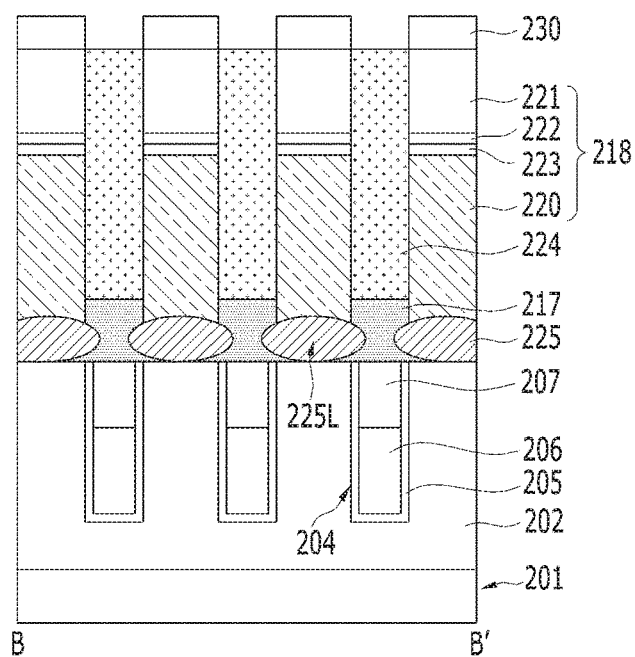
FIG. 3C is a cross-sectional view of the semiconductor device of FIG. 3A taken along a line B-B'.
Figure 3D:
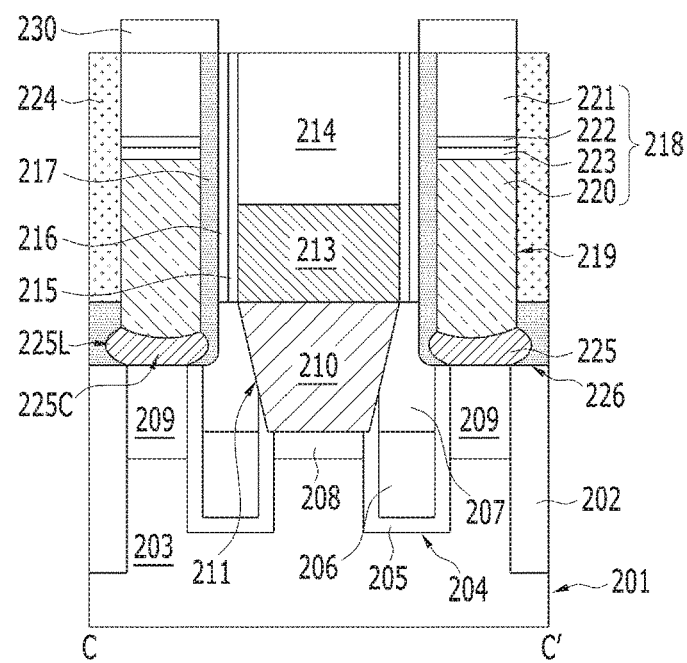
FIG. 3D is a cross-sectional view of the semiconductor device of FIG. 3A taken along a line C-C'.
Figure 3E:
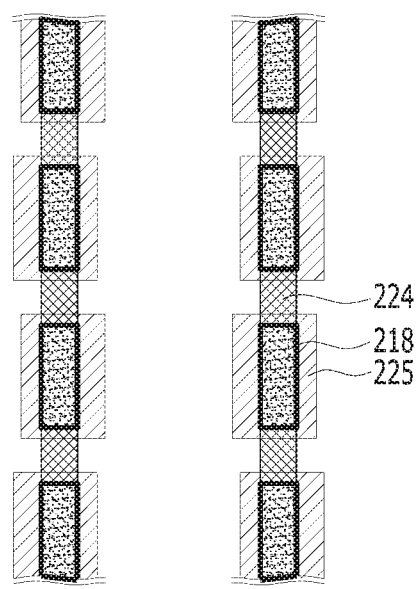
FIG. 3E illustrates an overlay between a plug pad and a contact plug.

FIGS. 3A to 3E illustrate a semiconductor device in accordance with a second embodiment of the present invention. The second embodiment of the present invention describes a semiconductor device having memory cells, such as a Dynamic Random Access Memory (DRAM). FIG. 3A is a plan view of a semiconductor device in accordance with a second embodiment of the present invention. FIG. 3B is a cross-sectional view of the semiconductor device of FIG. 3A taken along a line A-A'. FIG. 3C is a cross-sectional view of the semiconductor device of FIG. 3A taken along a line B-B'. FIG. 3D is a cross-sectional view of the semiconductor device of FIG. 3A taken along a line C-C'. FIG. 3E illustrates an overlay between a plug pad and a contact plug.

The semiconductor device 200 may include a plurality of memory cells. Each of the memory cells may include a cell transistor including a buried word line 206, a bit line 213, and a memory element 230.

Hereafter, the semiconductor device 200 is described in detail.

An isolation layer 202 and an active region 203 may be formed in a substrate 201. A plurality of active regions 203 may be defined by the isolation layer 202. The substrate 201 may include a material that is suitable for semiconductor processing. The substrate 201 may include a semiconductor substrate. The substrate 201 may be formed of a silicon-containing material. The substrate 201 may include silicon, monocrystalline silicon, polysilicon, amorphous silicon, a silicon germanium, a monocrystalline silicon germanium, a polycrystalline silicon germanium, carbon-doped silicon, a combination thereof, or a multi-layer of two or more of them. The substrate 201 may include another semiconductor material, such as germanium. The substrate 201 may include a III/V-group semiconductor substrate, such as a compound semiconductor substrate, e.g., a gallium arsenide (GaAs). The substrate 201 may include a Silicon On Insulator (SOI) substrate. The isolation layer 202 may be formed through a Shallow Trench Isolation (STI) process.

A gate trench 204 may be formed in the substrate 201. A gate dielectric layer 205 may be formed over the surface of the gate trench 204. A buried word line 206 filling a portion of the gate trench 204 may be formed over the gate dielectric layer 205. A sealing layer 207 may be formed over the buried word line 206. An upper surface of the sealing layer 207 may be as high as the surface of the substrate 201. The buried word line 206 may be positioned at a lower level than the surface of the substrate 201. The buried word line 206 may be formed of a low-resistance metal material, including, for example, of titanium nitride, tungsten and combinations thereof. In an embodiment, the buried word line 206 may be formed of titanium nitride and tungsten stacked sequentially. According to another embodiment of the present invention, the buried word line 206 may be formed of a titanium nitride (TiN) only.

A first impurity region 208 and a second impurity region 209 may be formed in the substrate 201. The first impurity region 208 and the second impurity region 209 may be called source/drain regions. The first impurity region 208 and the second impurity region 209 may be spaced apart from each other by the gate trench 204. As a result, the buried word line 206, the first impurity region 208, and the second impurity region 209 may become a cell transistor. The cell transistor may improve a short-channel effect that may be caused by the buried word line 206.

A bit line contact plug 210 may be formed over the substrate 201. The bit line contact plug 210 may be coupled to the first impurity region 208. The bit line contact plug 210 may be positioned in the inside of a bit line contact hole 211. The bit line contact hole 211 may be formed in a hard mask layer 212. The hard mask layer 212 may be formed over the substrate 201. The bit line contact hole 211 may expose the first impurity region 208. The lower surface of the bit line contact plug 210 may be lower than the upper surface of the substrate 201. The bit line contact plug 210 may be formed of polysilicon or a metal material. A portion of the bit line contact plug 210 may have a shorter line width than the diameter of the bit line contact hole 211. Accordingly, a gap G may be formed on both sides of the bit line contact plug 210. The gap G may be independently formed on both sides of the bit line contact plug 210. After all, one bit line contact plug 210 and a pair of gaps G may be positioned in the inside of the bit line contact hole 211, and the pair of the gaps G may be isolated from each other by the bit line contact plug 210. The gaps G may be positioned between the bit line contact plug 210 and a contact plug 218.

A bit line structure BL may be formed over the bit line contact plug 210. The bit line structure BL may include the bit line 213 and a bit line hard mask layer 214 over the bit line 213. The bit line structure BL may have a shape of a line that is extended in a direction intersecting with the buried word line 206. A portion of the bit line 213 may be coupled to the bit line contact plug 210. From the perspective of the A-A' direction, the bit line 213 and the bit line contact plug 210 may have the same line width. Therefore, the bit line 213 may be extended in one direction while covering the bit line contact plug 210. The bit line 213 may be formed of be formed of a metal material. The bit line hard mask layer 214 may be formed of an insulating material.

A bit line spacer 215 may be formed on a side wall of the bit line structure BL. The bottom portion of the bit line spacer 215 may fill the gap G on both sides of the bit line contact plug 210. The bit line spacer 215 be formed of a silicon oxide, a silicon nitride, or a combination thereof. The bit line spacer 215 may have an NON (Nitride-Oxide-Nitride) structure. According to another embodiment of the present invention, the bit line spacer 215 may include an air gap. For example, the bit line spacer 215 may have an NAN (Nitride-Air gap-Nitride) structure.

A first spacer 216 may be formed on a side wall of the bit line spacer 215. A second spacer 217 may be formed on a side wall of the first spacer 216.

A contact plug 218 may be formed between the neighboring bit line structures BL. The contact plug 218 may be formed in a storage node contact hole 219. The storage node contact hole 219 may have a high aspect ratio. The contact plug 218 may be coupled to the second impurity region 209. The contact plug 218 may include a first plug 220 and a second plug 221. The contact plug 218 may further include an ohmic contact layer 222 between the first plug 220 and the second plug 221, and an interface doping layer 223 between the ohmic contact layer 222 and the first plug 220. From the perspective of a direction parallel to the bit line structure BL, a plug isolation layer 224 may be formed between the neighboring contact plugs 218. The plug isolation layer 224 may be formed between the neighboring bit line structures BL, and provide the storage node contact hole 219 along with the hard mask layer 212.

A plug pad 225 may be formed below the contact plug 218. The plug pad 225 may couple the contact plug 218 and the second impurity region 209 to each other. The plug pad 225 may be formed through a Selective Epitaxial Growth (SEG) process. The plug pad 225 may be the same as the plug pad 113 shown in FIGS. 1A and 1C.

The plug pad 225 may fill a recess 226. The recess 226 may be formed below the storage node contact hole 219. The recess 226 may be extended into the inside of the substrate 201. The bottom surface of the recess 226 may be positioned at a lower level than the upper surface of the substrate 201. The bottom surface of the recess 226 may be positioned at a higher level than the bottom surface of the bit line contact plug 210. The recess 226 may be defined by the lower portion of a line-type opening 226L. The line-type opening 226L may be a line-type opening that is defined between the neighboring bit line structures BL. The line width of the line-type opening 226L may be controlled by the bit line structure BL, the bit line spacer 215, and the first spacer 216. The storage node contact hole 219 may have a shorter line width than the line-type opening 226L. The second spacer 217 may be formed on a side wall of the line-type opening 226L. The lower portion of the second spacer 217 may be extended to contact the upper surface of the plug pad 225. The line width of the storage node contact hole 219 may be shorter than the line width of the line-type opening 226L due to the second spacer 217. The size of the storage node contact hole 219 may be controlled by the second spacer 217 and the plug isolation layer 224. The line width of the storage node contact hole 219 may be shorter than the line width of the plug pad 225. As a result, the storage node contact hole 219 may land over the surface of the plug pad 225.

Referring to FIG. 3D, the plug pad 225 may include a plug pad central portion 225C and a plug pad side extended portion 225L. The plug pad central portion 225C may be a portion that is formed in the upper portion of the active region 203, and the plug pad side extended portion 225L may be a portion that grows up toward the side direction from the plug pad central portion 225C. With the plug pad side extended portion 225L, an overlay margin between the contact plug 218 and the plug pad 225 may be secured.

Although not illustrated, the memory element 230 may be formed over the contact plug 218. The memory element 230 may include a capacitor including a storage node. The storage node may include a pillar-type storage node.

Although not illustrated, a dielectric layer and a plate node may be further formed over the storage node. The storage node may include a cylinder-type storage node, other than the pillar-type storage node. The storage node may be coupled to the contact plug 218. The contact plug 218 may be referred to as 'a storage node contact plug'.

According to another embodiment of the present invention, diverse forms of memory elements may be disposed over the contact plug 218.

Figure 4A:
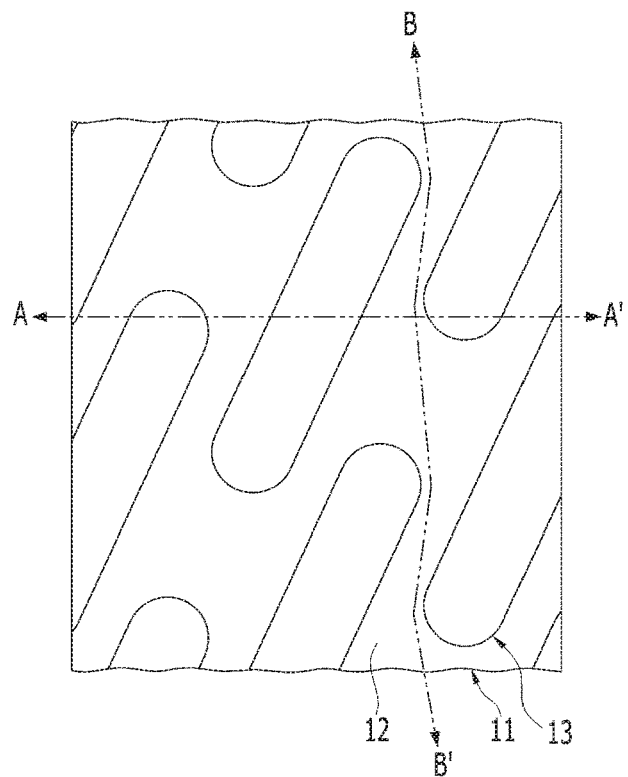
FIGS. 4A to 4Q are plan views illustrating an example of a method for fabricating the semiconductor device in accordance with an embodiment of the present invention.
Figure 4B:
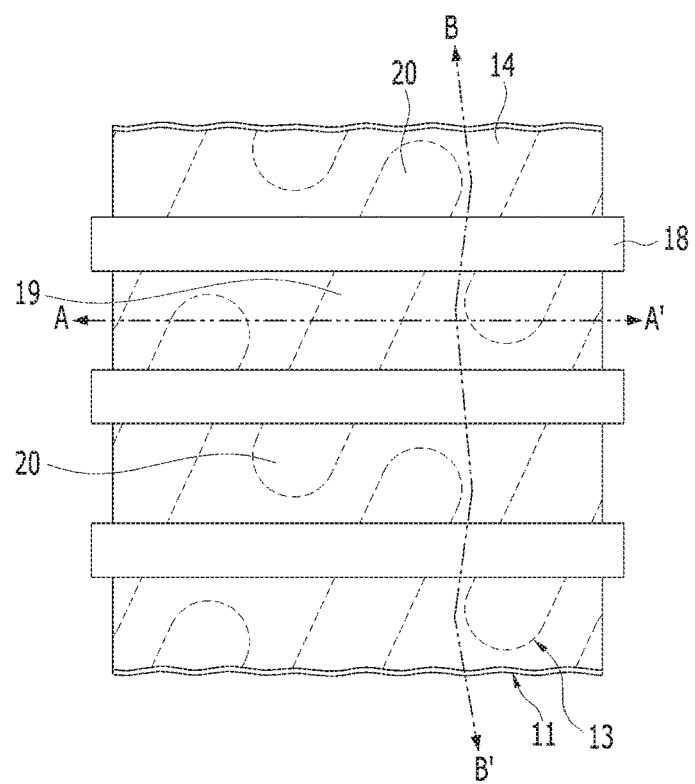
Figure 4C:
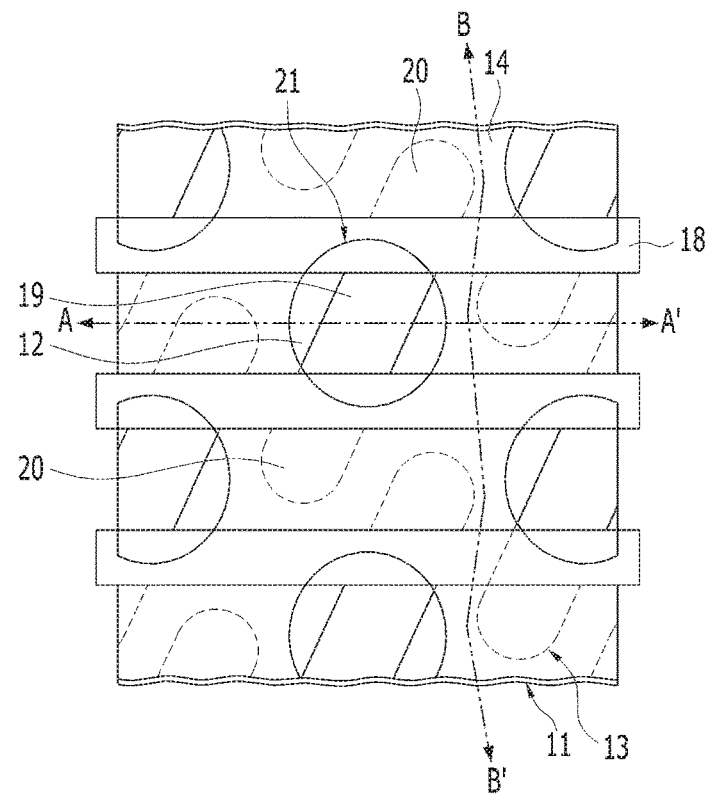
Figure 4D:
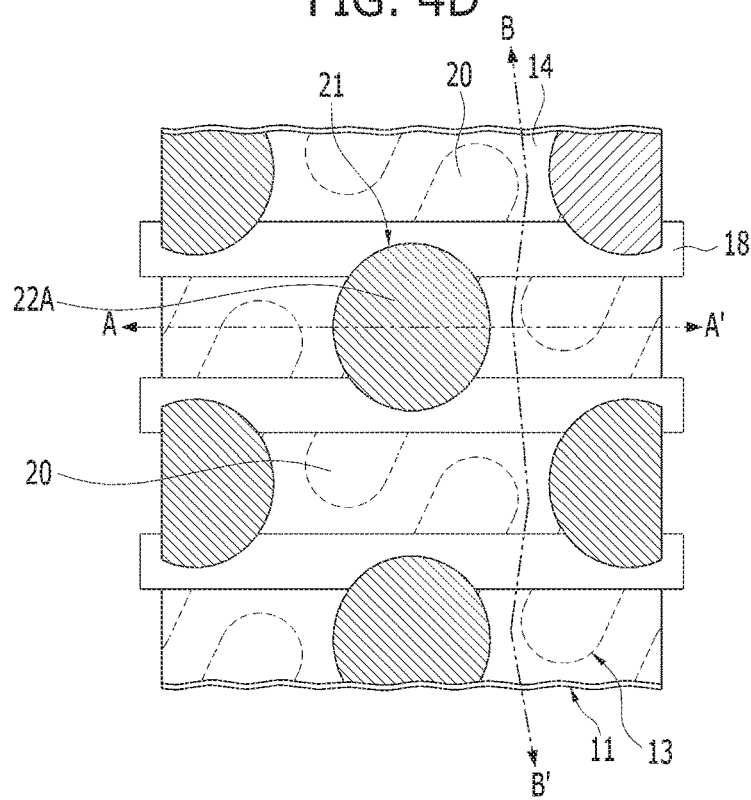
Figure 4E:
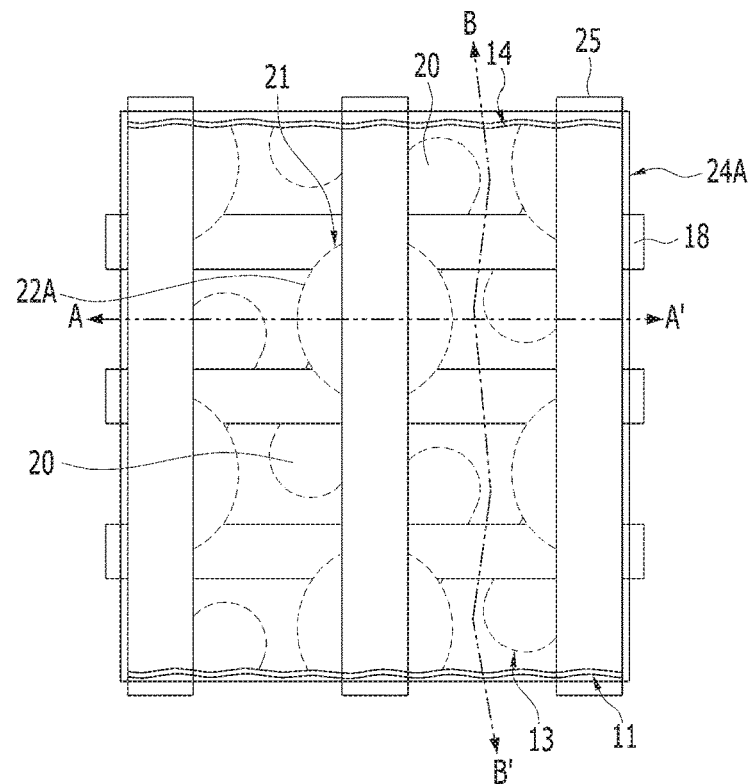
Figure 4F:
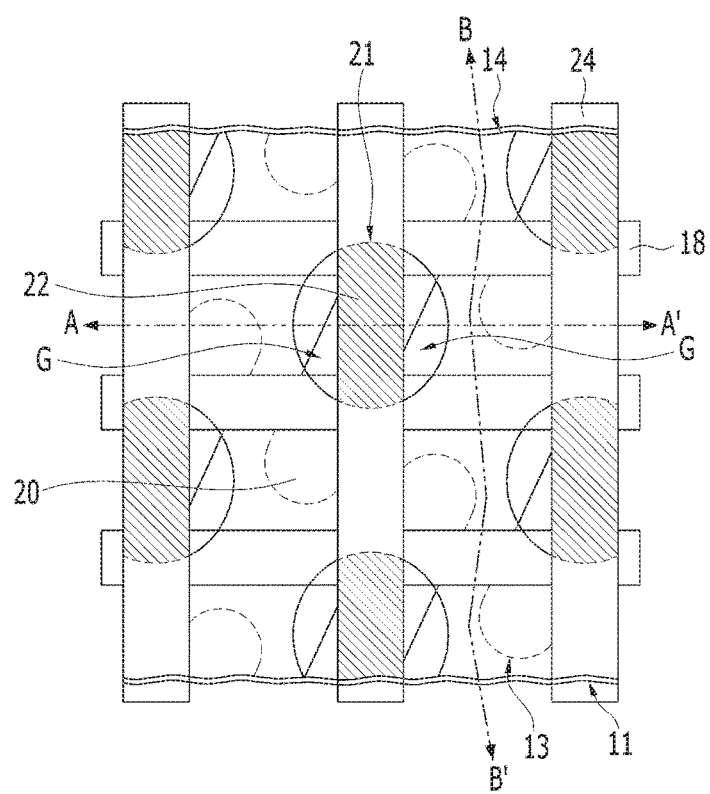
Figure 4G:
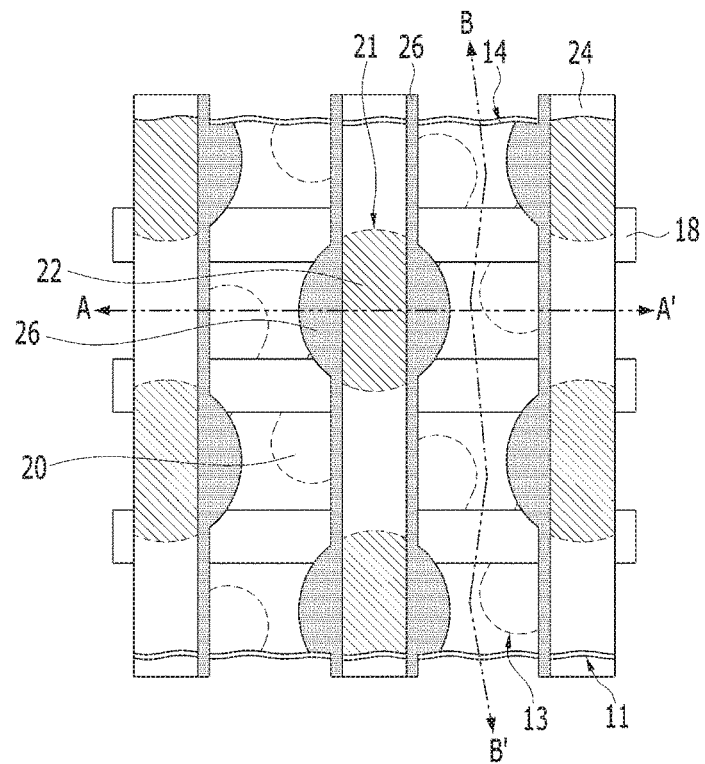
Figure 4H:
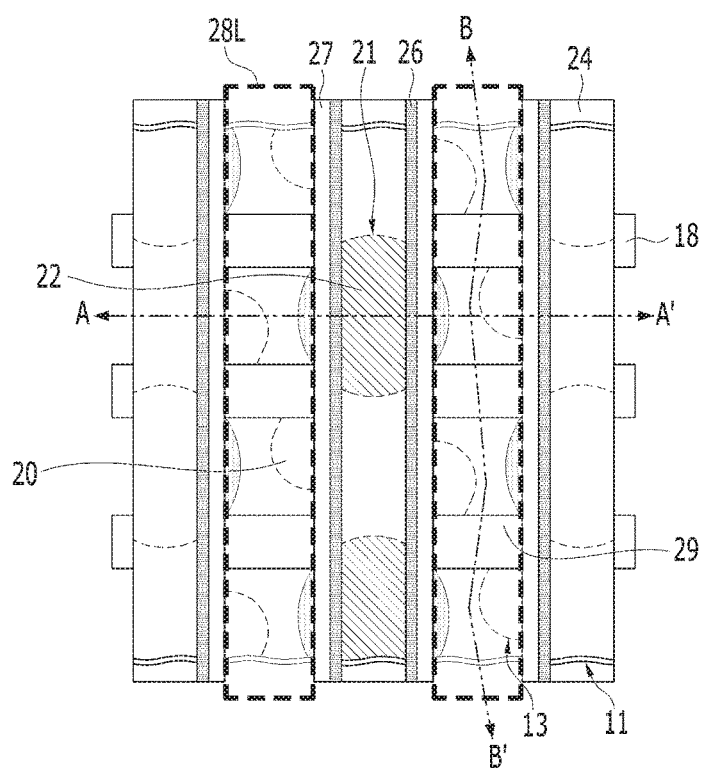
Figure 4I:
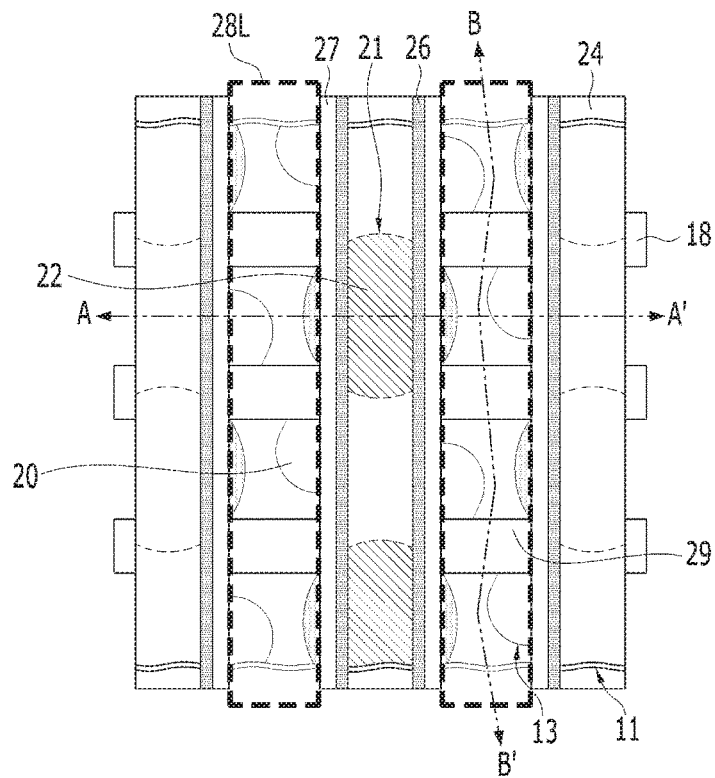
Figure 4J:
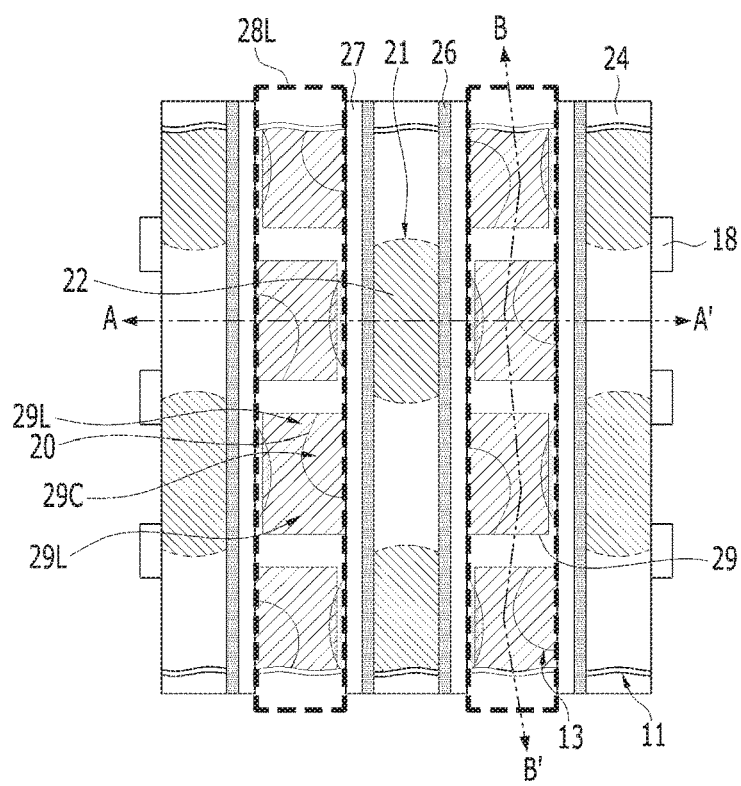
Figure 4K:
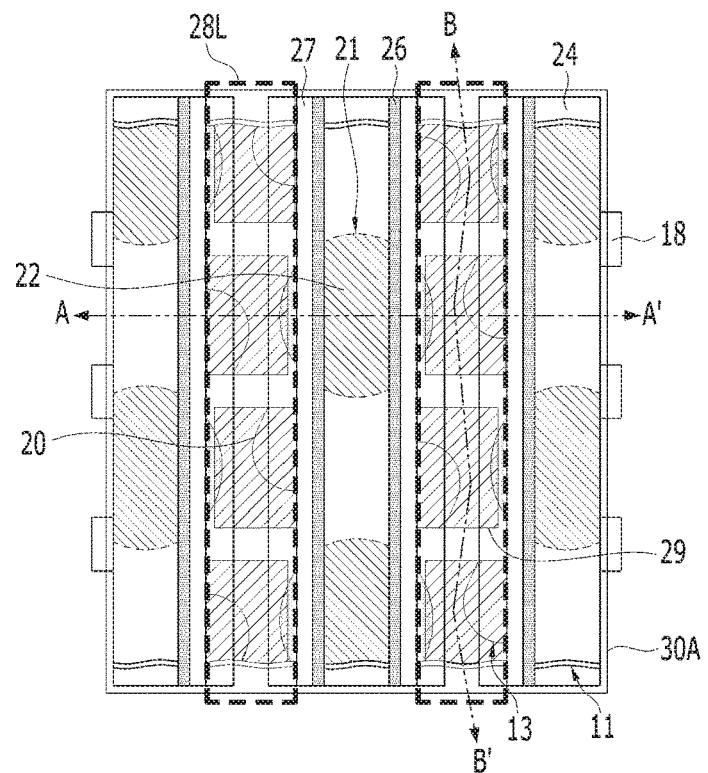
Figure 4L:
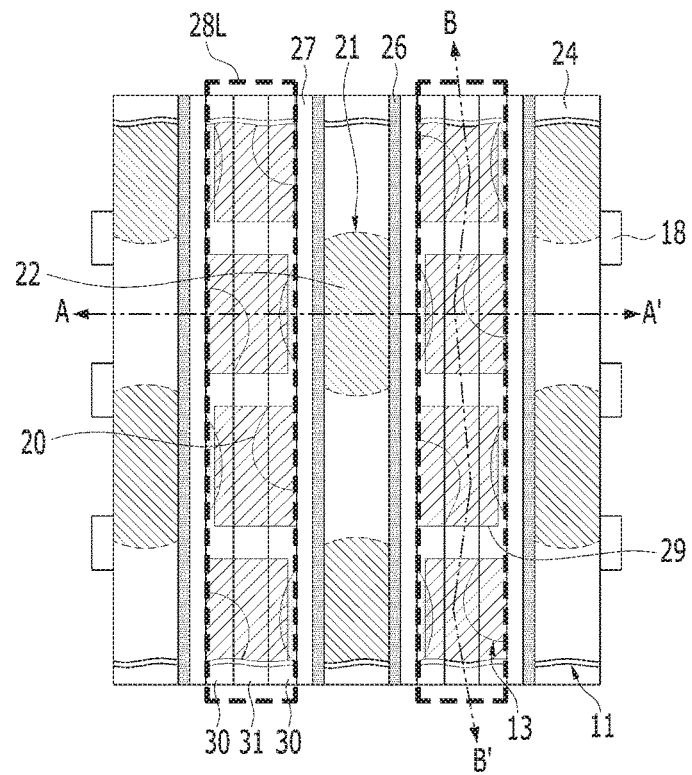
Figure 4M:
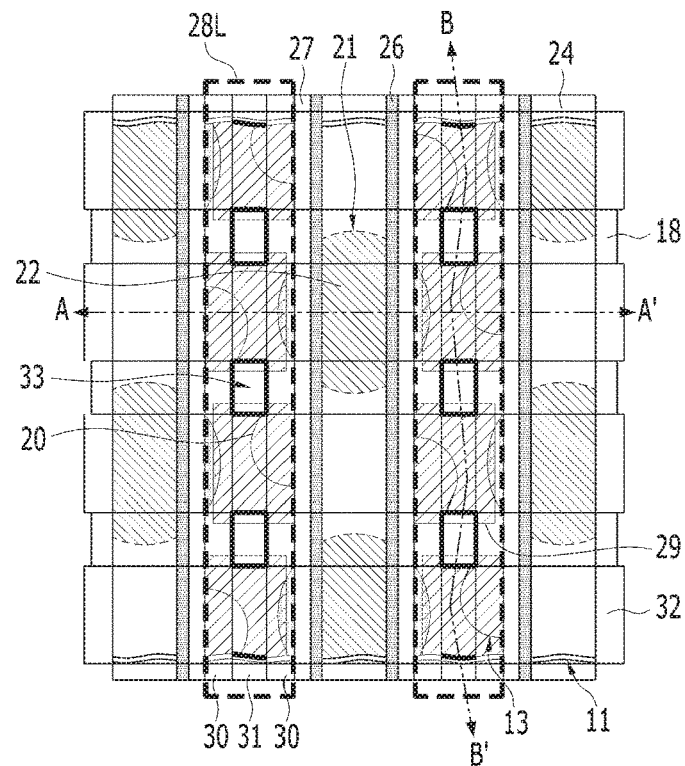
Figure 4N:
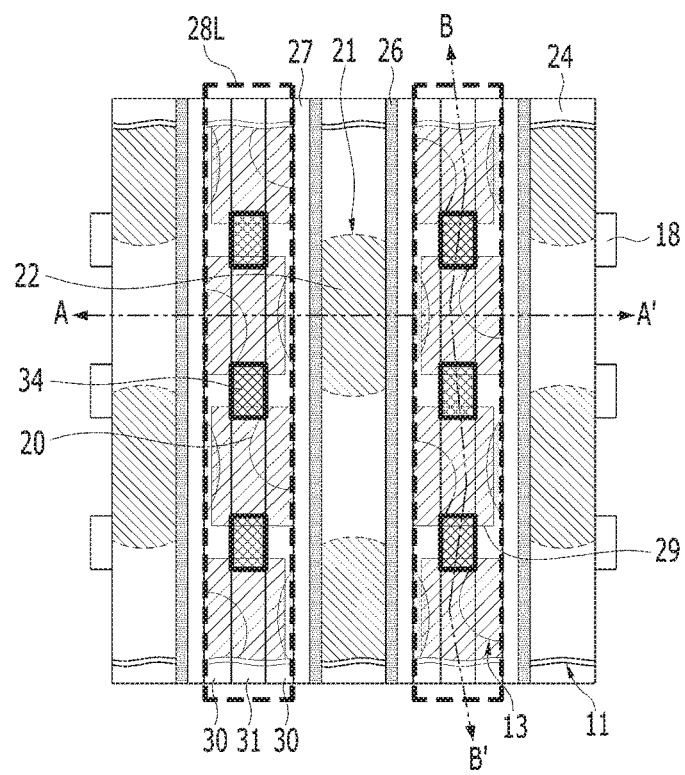
Figure 4O:
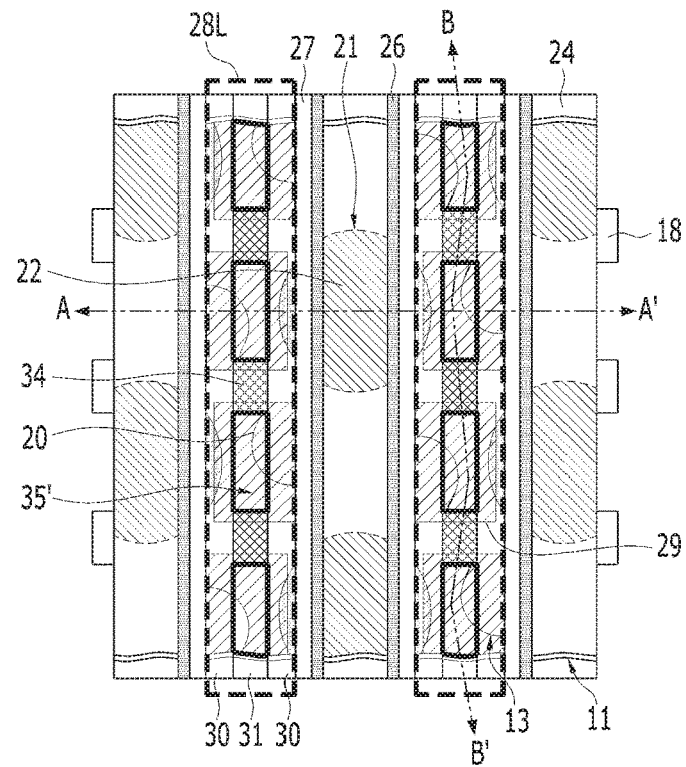
Figure 4P:
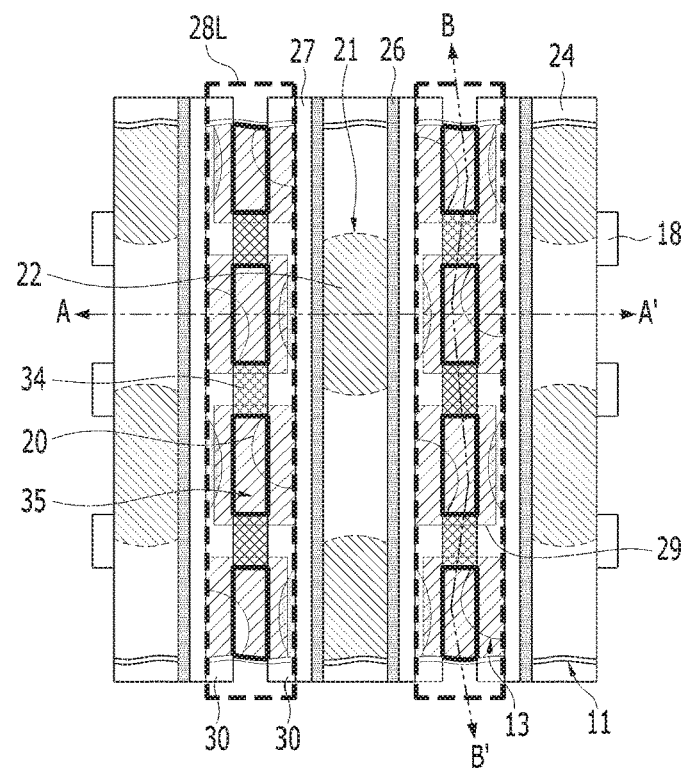
Figure 4Q:
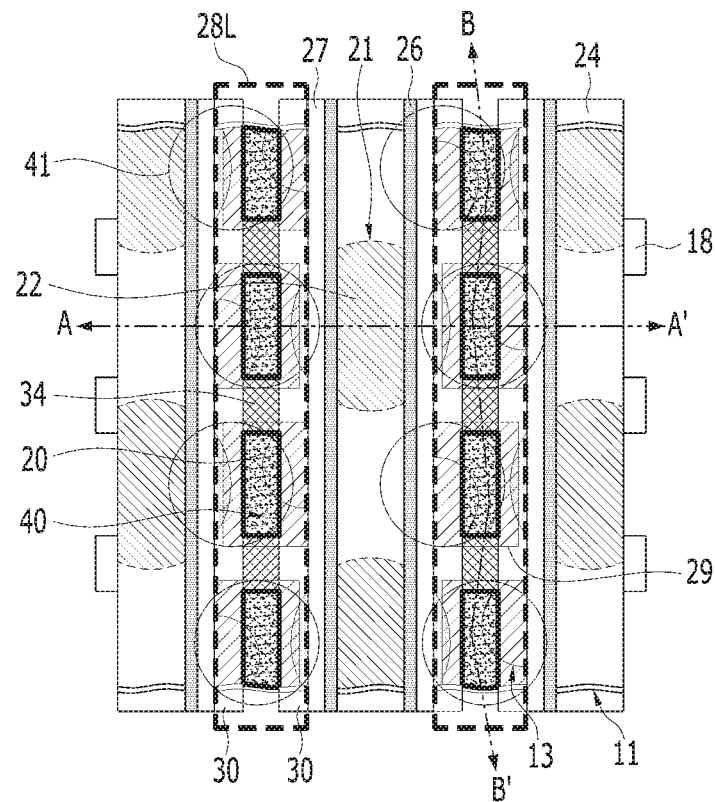
Figure 5A:
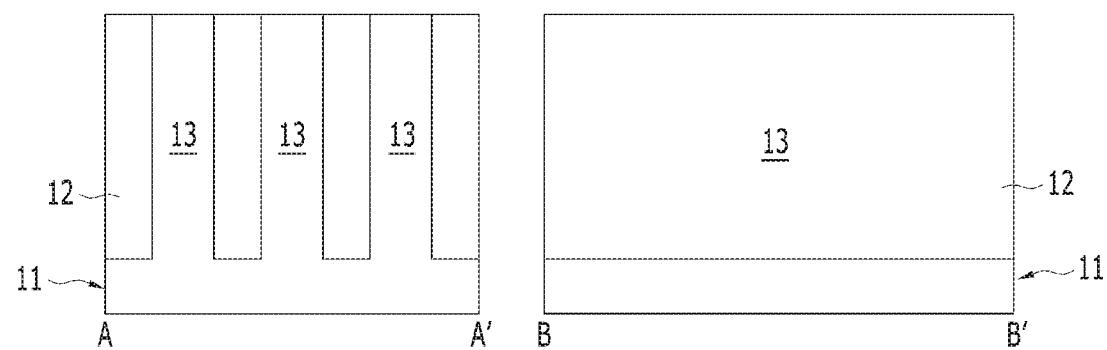
FIGS. 5A to 5Q are cross-sectional views of the semiconductor device of FIGS. 4A to 4Q taken along a line A-A' and a line B-B'.

FIGS. 4A to 4Q are plan views illustrating an example of a method for fabricating the semiconductor device in accordance with the second embodiment of the present invention. FIGS. 5A to 5Q are cross-sectional views of the semiconductor device of FIGS. 4A to 4Q taken along a line A-A' and a line B-B'.

A DRAM may generally include a cell region where memory cells are formed and a peripheral circuit region that controls the input/output of data to/from the memory cells. When a plurality of constituent elements are formed in the cell region and the peripheral circuit region, some of the constituent elements may be formed concurrently, in other words, some of the constituent elements may be merged.

Referring to FIGS. 4A and 5A, an isolation layer 12 may be formed in a substrate 11. An active region 13 may be defined by the isolation layer 12. The isolation layer 12 may be formed through a Shallow Trench Isolation (STI) process. The STI process may be performed as follows. An isolation trench (not shown) may be formed by etching the substrate 11. The isolation trench may be filled with an insulating material so as to form the isolation layer 12. The isolation layer 12 may be formed of a silicon oxide, a silicon nitride, or a combination thereof. The isolation trench may be filled with the insulating material through a Chemical Vapor Deposition (CVD) process or another deposition process. A planarization process, such as a Chemical-Mechanical Polishing (CMP) process, may be additionally performed.

Figure 5B:
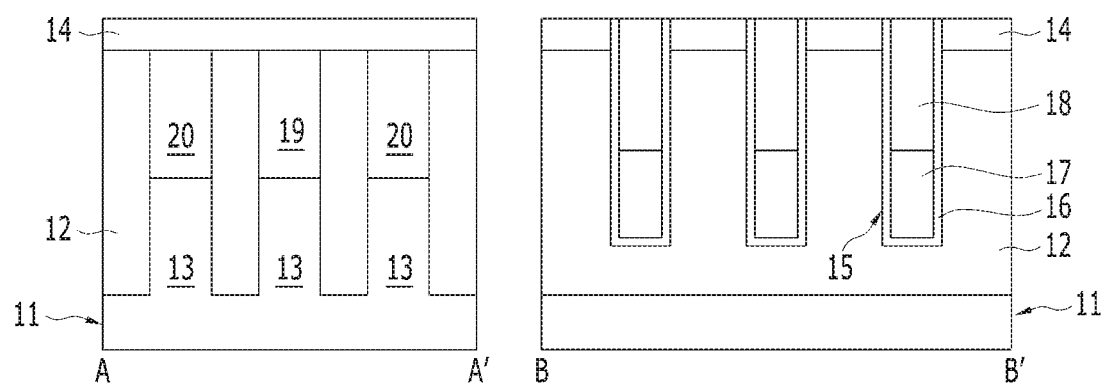

Referring to FIGS. 4B and 5B, subsequently, a buried gate structure may be formed in the inside of the substrate 11. The buried gate structure may be referred to as a buried word line structure. The buried gate structure may include a gate trench 15, a gate dielectric layer 16 covering a bottom surface and a side wall of the gate trench 15, a gate electrode 17 filling a portion of the gate trench 15 over the gate dielectric layer 16, and a sealing layer 18 formed over the gate electrode 17.

The buried gate structure may be formed as follows.

First of all, the gate trench 15 may be formed in the inside of the substrate 11. The gate trench 15 may have a shape of a line that traverses the active region 13 and the isolation layer 12. The gate trench 15 may be formed by forming a mask pattern (not shown) over the substrate 11 and performing an etch process by using the mask pattern as an etch mask. To form the gate trench 15, a hard mask layer 14 may be used as an etch barrier. The hard mask layer 14 may be patterned by a mask pattern. The hard mask layer 14 may be formed of a silicon oxide. The hard mask layer 14 may include TEOS (Tetra Ethyl Ortho Silicate). The gate trench 15 may be formed to be shallower than the isolation trench. In other words, the lower surface of the gate trench 15 may be positioned at a higher level than the lower surface of the isolation layer 12. The depth of the gate trench 15 may be sufficiently deep to increase the average cross-section of a buried gate electrode, which is to be formed subsequently. Accordingly, the resistance of the gate electrode may be decreased. According to another embodiment of the present invention, the bottom edges of the gate trench 15 may have a curvature. With the curvature, the unevenness in the bottom portion of the gate trench 15 may be minimized, and thereby, filling of the gate electrode may be performed more easily.

Although not illustrated, after the gate trench 15 is formed, a pin region may be formed. The pin region may be formed by recessing a portion of the isolation layer 12.

Subsequently, the gate dielectric layer 16 may be formed over the bottom surface and side walls of the gate trench 15. Before the gate dielectric layer 16 is formed, etch damage on the surface of the gate trench 15 may be cured. For example, after a sacrificial oxide is formed through a thermal oxidation process, the sacrificial oxide may be removed.

The gate dielectric layer 16 may be formed through a thermal oxidation process. For example, the gate dielectric layer 16 may be formed by oxidizing the bottom and side walls of the gate trench 15.

According to another embodiment of the present invention, the gate dielectric layer 16 may be formed through a deposition process such as a Chemical Vapor Deposition (CVD) process or an Atomic Layer Deposition (ALD) process. The gate dielectric layer 16 may be formed of any suitable material including a high-k material, an oxide, a nitride, an oxynitride, or a combination thereof. The high-k material may include a hafnium-containing material. The hafnium-containing material may include a hafnium oxide, a hafnium silicon oxide, a hafnium silicon oxynitride, or a combination thereof. According to another embodiment of the present invention, the high-k material may include a lanthanum oxide, a lanthanum aluminum oxide, a zirconium oxide, a zirconium silicon oxide, a zirconium silicon oxynitride, an aluminum oxide, and combinations thereof. As for the high-k material, another known high-k material may be selectively used.

According to another embodiment of the present invention, the gate dielectric layer 16 may be formed by depositing a liner polysilicon layer and then radical-oxidizing the liner polysilicon layer.

According to another embodiment of the present invention, the gate dielectric layer 16 may be formed by depositing a liner silicon nitride layer and then radical-oxidizing the liner silicon nitride layer.

Subsequently, the gate electrode 17 may be formed over the gate dielectric layer 16. The gate electrode 17 may be formed by forming a conductive layer (not shown) to fill the gate trench 15 and then performing a recessing process. As for the recessing process, an etch-back process may be performed, or a Chemical-Mechanical Polishing (CMP) process and an etch-back process may be performed sequentially. The gate electrode 17 may have a recessed shape that fills a portion of the gate trench 15. In other words, the upper surface of the gate electrode 17 may be positioned at a lower level than the upper surface of the active region 13. The gate electrode 17 may be formed of a suitable material including a metal, a metal nitride, or a combination thereof. For example, the gate electrode 17 may be formed of a titanium nitride (TiN), tungsten (W), or a titanium nitride/tungsten (TiN/W). The titanium nitride/tungsten (TiN/W) may be a structure that is formed by conformally forming a titanium nitride and then filling a portion of the gate trench 15 with tungsten. The gate electrode 17 may be formed of a titanium nitride only, which may be referred to as 'a gate electrode 17 of a TiN-only structure'.

Subsequently, the sealing layer 18 may be formed over the gate electrode 17. The sealing layer 18 may include an insulating material. Over the gate electrode 17, the other portion of the gate trench 15 may be filled with the sealing layer 18. The sealing layer 18 may be formed of a silicon nitride. According to another embodiment of the present invention, the sealing layer 18 may be formed of a silicon oxide. According to another embodiment of the present invention, the sealing layer 18 may have an NON (Nitride-Oxide-Nitride) structure. The upper surface of the sealing layer 18 may be positioned at the same level as the upper surface of the hard mask layer 14. To this end, a CMP process may be performed when the sealing layer 18 is formed.

After the buried gate electrode described above is formed, a first impurity region 19 and a second impurity region 20 may be formed. The first impurity region 19 and the second impurity region may be formed through a doping process, such as an implantation process. The first impurity region 19 and the second impurity region 20 may have the same depth. According to another embodiment of the present invention, the first impurity region 19 may be deeper than the second impurity region 20. The first impurity region 19 and the second impurity region 20 may be called source/drain regions. The first impurity region 19 may be a region to be coupled to a bit line contact plug. The second impurity region 20 may be a region to be coupled to a storage node contact plug.

The gate electrode 17, the first impurity region 19, and the second impurity region 20 may form a cell transistor of a memory cell.

Figure 5C:
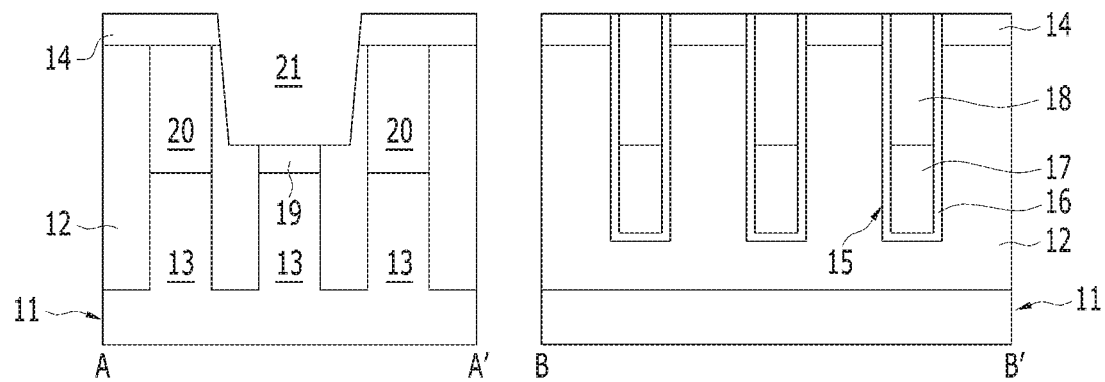

Referring to FIGS. 4C and 5C, a first contact hole 21 may be formed. The first contact hole 21 may be formed by using a contact mask (not shown) and etching the hard mask layer 14. The first contact hole 21 may have a circular shape or an oval shape from a top view. The first contact hole 21 may expose a portion of the substrate 11. The first contact hole 21 may have a diameter that is controlled to a predetermined line width. The first contact hole 21 may expose a portion of the active region 13. For example, the first impurity region 19 may be exposed through the first contact hole 21. The first contact hole 21 may have a longer diameter than the width of a short axis of the active region 13. Therefore, the first impurity region 19, the isolation layer 12, and a portion of the sealing layer 18 may be etched in the etch process for forming the first contact hole 21. In other words, the sealing layer 18, the first impurity region 19, and the isolation layer 12 below the first contact hole 21 may be recessed to a predetermined depth. In this way, the lower portion of the first contact hole 21 may be extended into the inside of the substrate 11. As the first contact hole 21 is extended, the surface of the first impurity region 19 may be recessed, and the surface of the first impurity region 19 may be positioned at a lower level than the surface of the active region 13. The first contact hole 21 may be called 'a bit line contact hole'.

Figure 5D:
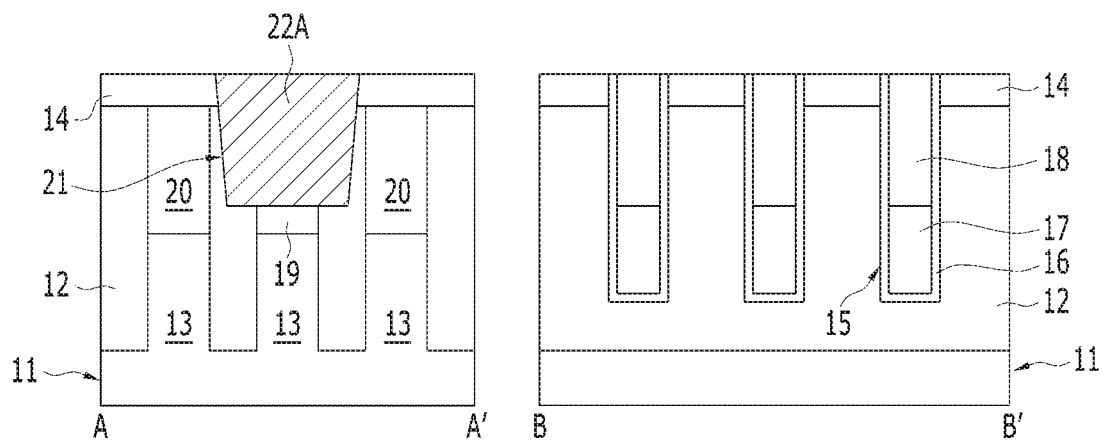

Referring to FIGS. 4D and 5D, a preliminary plug 22A may be formed. The preliminary plug 22A may be formed through a Selective Epitaxial Growth (SEG) process. For example, the preliminary plug 22A may be formed of SEG-SiP. Through the SEG process, the preliminary plug 22A may be formed without voids. According to another embodiment of the present invention, the preliminary plug 22A may be formed by depositing a polysilicon layer and a CMP process. The preliminary plug 22A may fill the first contact hole 21. The upper surface of the preliminary plug 22A may be positioned at the same level as the upper surface of the hard mask layer 14.

Figure 5E:
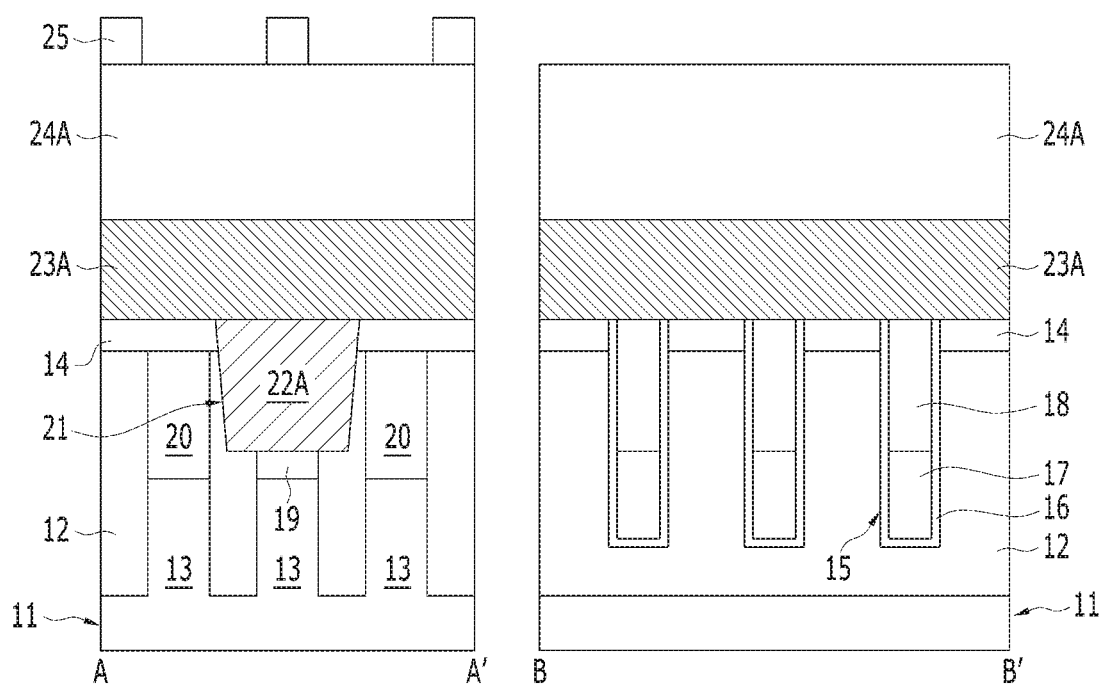

Referring to FIGS. 4E and 5E, a conductive layer 23A and a hard mask material layer 24A may be stacked. The conductive layer 23A and the hard mask material layer 24A may be sequentially stacked over the preliminary plug 22A and the hard mask layer 14. The conductive layer 23A may be formed of a metal-containing material. The conductive layer 23A may be formed of a metal, a metal nitride, a metal silicide, or a combination thereof. According to an embodiment of the present invention, the conductive layer 23A may include tungsten (W). According to another embodiment of the present invention, the conductive layer 23A may include stacked layers of titanium nitride and tungsten (TiN/W). Herein, the titanium nitride may function as a barrier. The hard mask material layer 24A may be formed of an insulating material having an etch selectivity with respect to the preliminary plug 22A. The hard mask material layer 24A may be formed of an insulating material such as a silicon oxide or a silicon nitride or combinations thereof. According to an embodiment of the present invention, the hard mask material layer 24A may be formed of a silicon nitride.

A bit line mask layer 25 may be formed over the hard mask material layer 24A. The bit line mask layer 25 may include a photoresist pattern. The bit line mask layer 25 may be formed through a patterning method such as a spacer patterning technology (SPT) or a double patterning technology (DPT). From the perspective of a top view, the bit line mask layer 25 may have a pattern of a plurality of lines that are extended in one direction. The bit line mask layer 25 may be formed of a material having an etch selectivity with respect to the conductive layer 23A and the hard mask material layer 24A.

Figure 5F:
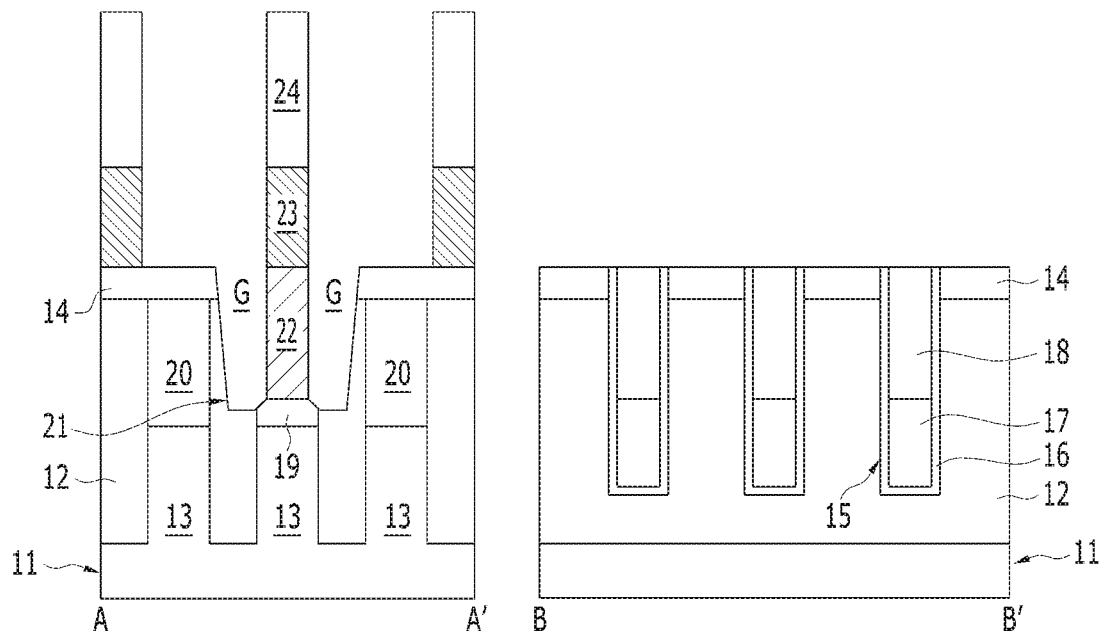

Referring to FIGS. 4F and 5F, a bit line 23 and a bit line contact plug 22 may be formed. The bit line 23 and the bit line contact plug 22 may be formed simultaneously. The bit line 23 and the bit line contact plug 22 may be formed by performing an etch process using the bit line mask layer 25.

The hard mask material layer 24A and the conductive layer 23A may be etched by using the bit line mask layer 25 as an etch barrier. As a result, a bit line structure including the bit line 23 and a bit line hard mask layer 24 may be formed. The bit line 23 may be formed by etching the conductive layer 23A. The bit line hard mask layer 24 may be formed by etching the hard mask material layer 24A.

Subsequently, the preliminary plug 22A may be etched to have the same line width as the line width of the bit line 23. As a result, the bit line contact plug 22 may be formed. The bit line contact plug 22 may be formed over the first impurity region 19. The bit line contact plug 22 may couple the first impurity region 19 and the bit line 23 to each other. The bit line contact plug 22 may be formed in the inside of the first contact hole 21. The line width of the bit line contact plug 22 may be shorter than the diameter of the first contact hole 21. Therefore, a gap G may be formed around the bit line contact plug 22.

As described above, as the bit line contact plug 22 is formed, the gap G may be formed in the inside of the first contact hole 21. This is because the bit line contact plug 22 is formed to be etched shorter than the diameter of the first contact hole 21. The gap G may be formed not in a shape surrounding the bit line contact plug 22 but the gap G may be independently formed on both side walls of the bit line contact plug 22. After all, one bit line contact plug 22 and a pair of gaps G may be positioned in the inside of the first contact hole 21, and the pair of the gaps G may be isolated from each other by the bit line contact plug 22. The bottom surface of the gaps G may be extended into the inside of the isolation layer 12. In other words, the lower surface of the gaps G may be positioned at a lower level than the recessed upper surface of the first impurity region 19.

The bit line mask layer 25 may be removed.

Figure 5G:
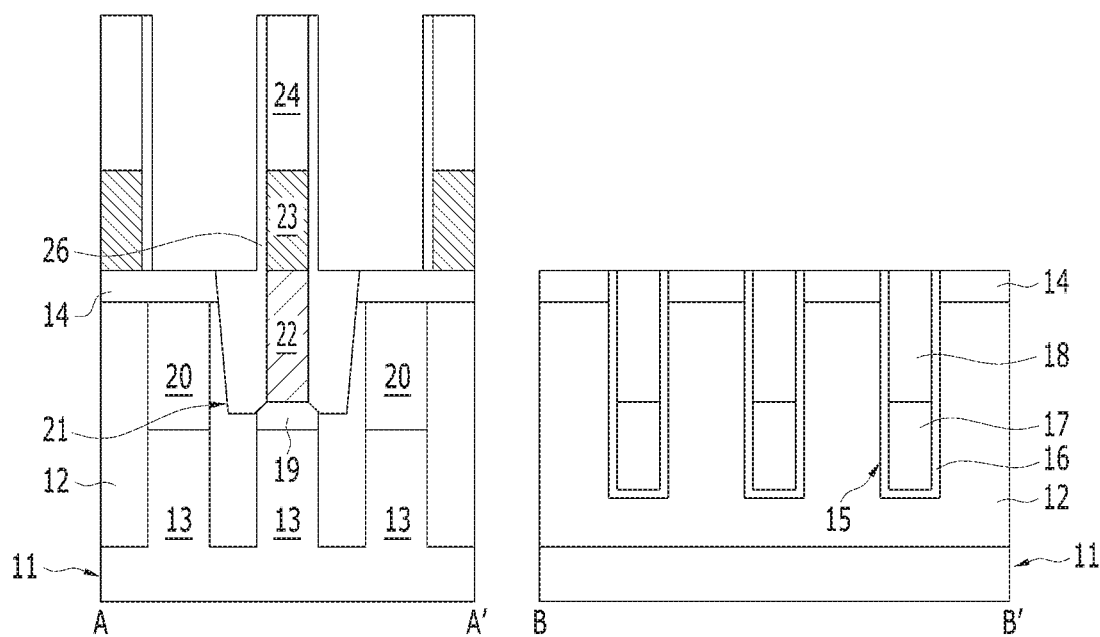

Referring to FIGS. 4G and 5G, a bit line spacer 26 may be formed. The bit line spacer 26 may be positioned on the side walls of the bit line hard mask layer 24, the bit line contact plug 22 and the bit line 23. The bit line spacer 26 may have a shape of a line that is extended in parallel along both of the side walls of the bit line 23 and the bit line hard mask layer 24. The lower portion of the bit line spacer 26 may fill the gaps G while covering both side walls of the bit line contact plug 22. The bit line spacer 26 may be formed by depositing a first spacer material (no reference number given) and performing an etch-back process. The bit line spacer 26 may be formed of an insulating material such as a silicon oxide or a silicon nitride or combinations thereof.

Figure 5H:
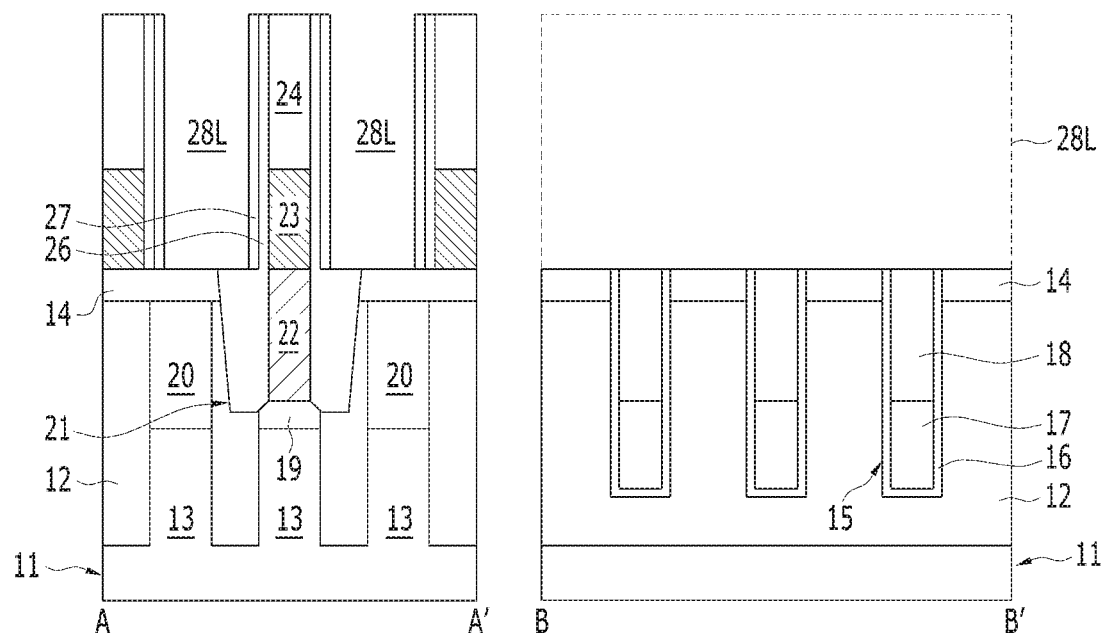

Referring to FIGS. 4H and 5H, a first spacer 27 may be formed. The first spacer 27 may be formed by depositing a spacer material (no reference number given) and performing an etch-back process. The first spacer 27 may be formed of an insulating material such as a silicon oxide or a silicon nitride or combinations thereof. The bit line spacer 26 and the first spacer 27 may be formed of the same material.

After the first spacer 27 is formed, a line-type opening 28L may be defined between the neighboring bit lines 23. The line-type opening 28L may be in parallel to the bit line 23.

Figure 5I:
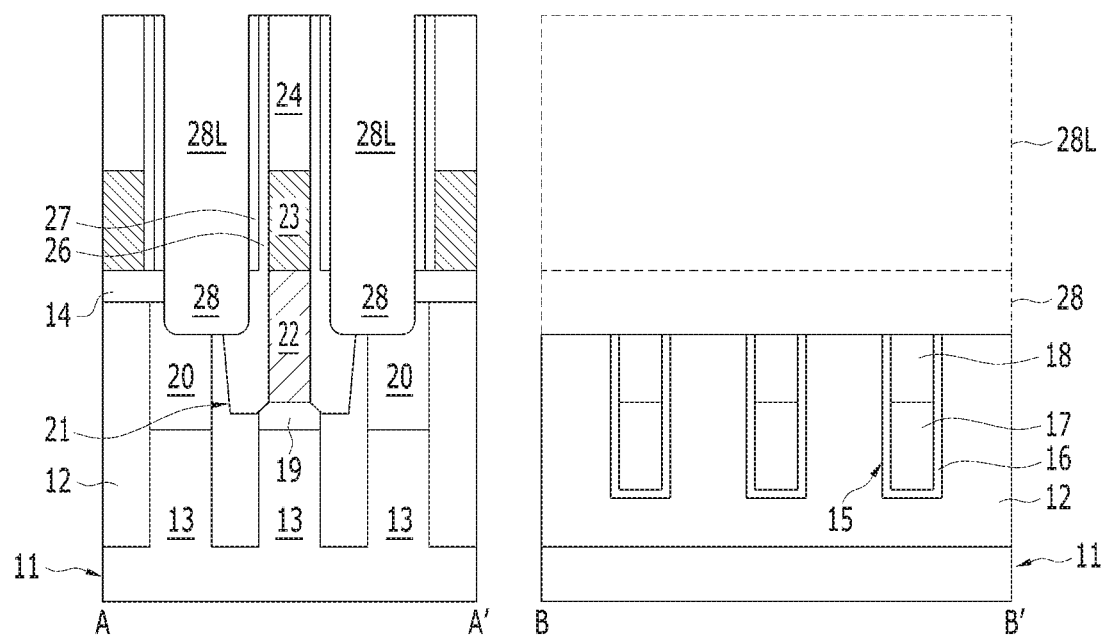

Referring to FIGS. 4I and 5I, the lower materials may be etched to be self-aligned to the first spacer 27. As a result, a recess 28 may be formed below the line-type opening 28L. The recess 28 may be formed by etching the lower portion of the bit line spacer 26, the isolation layer 12, and the second impurity region 20 to a predetermined depth. The recess 28 may be extended into the inside of the substrate 11. The bottom surface of the recess 28 may be positioned at a lower level than the upper surface of the bit line contact plug 22. The bottom surface of the recess 28 may be positioned at a higher level than the bottom surface of the bit line contact plug 22.

The recess 28 may have a shape of a line that is extended in one direction, just as the line-type opening 28L does. From the perspective of a top view, the recess 28 may expose the second impurity regions 20 of the neighboring active regions 13 concurrently. Also, the recess 28 may expose the isolation layer 12 between the active regions 13.

Figure 5J:
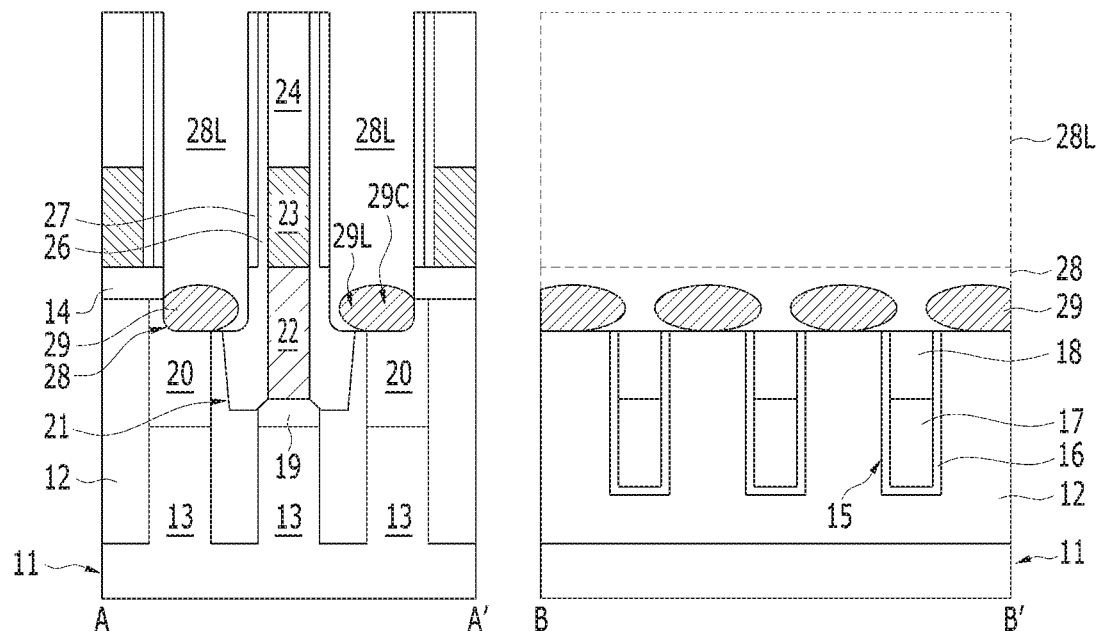

Referring to FIGS. 4J and 5J, a plug pad 29 filling a portion of the recess 28 may be formed. The plug pad 29 may be formed through a bottom-up growth process. The plug pad 29 may be formed through a selective epitaxial growth (SEG) process. The plug pad 29 may be formed by taking the second impurity region 20 as a seed. The plug pad 29 may include a silicon-containing material. The plug pad 29 may be an epitaxial layer. The plug pad 29 may be a silicon-containing epitaxial layer. The plug pad 29 may include SEG-Si, SEG-SiGe, or SEG-SiC. According to another embodiment of the present invention, the plug pad 29 may include SEG-Si doped with an N-type dopant, SEG-SiGe doped with an N-type dopant, or SEG-SiC doped with an N-type dopant. For example, the plug pad 29 may be formed of SEG-SiP. The plug pad 29 may be formed using a silicon source gas and an additive gas. The silicon source gas may include silane ($SiH_4$), dichlorosilane ($SiH_2Cl_2$, DCS), or a combination thereof. The additive gas may include hydrogen chloride (HCl).

The upper surface of the plug pad 29 may be positioned at a lower level than the upper surface of the bit line contact plug 22.

As described above, since the selective epitaxial growth process is performed to form the plug pad 29, the fabrication process may be simplified. Also, the inside of the recess 28 may be filled with the plug pad 29 without voids.

The plug pad 29 may include a central portion 29C and a side extended portion 29L. The central portion 29C may grow up over the active region 13. The side extended portion 29L may laterally grow up from the side of the central portion 29C. The central portion 29C may be called a portion that is formed over the active region 13. The side extended portion 29L may be called a portion that is laterally extended toward the regions over the isolation layer 12 and the sealing layer 18.

The side extended portion 29L of the plug pad 29 may be able to improve an open margin when a contact hole 35 is formed later. Therefore, selective growth is important in the formation of the plug pad 29. Also, it is required to control the amount of lateral growth of the side extended portion 29L.

If the selectivity of the selective growth is insufficient, blanket deposition may occur during the formation of a second spacer 30, which will be performed subsequently, causing plug blockage or bridge. Also, since the plug pad 29 is formed before a plug isolation layer 34 is formed, lateral over-growth may occur. Also, when the entire portion of the recess 28 and the line-type opening 28L is filled with the plug pad 29, a short-circuit may occur between the neighboring plug pads 29 in the direction that the line-type opening 28L is extended.

In order to control the selectivity and lateral growth, proper conditions need to be found out through diverse combinations of the silicon source gas (e.g., $SiH_4$, DCS, a mixed gas of $SiH_4$ and DCS), flow rates of HCl, and deposition temperatures.

To take an example of finding out the selectivity, the flow rate of HCl may be raised while using a dichlorosilane (DCS) source gas. However, since good selectivity may deteriorate a growth rate, productivity may go down. To solve the problem, 1) a method of using a mixed gas of $SiH_4$ and DCS as the silicon source gas or 2) a method of raising the growth temperature may have to be applied.

Since the plug pad 29 formed through the SEG process is performed before the plug isolation layer 34 (see FIG. 5M) is formed, it is important to control the lateral growth. The control of the lateral growth may mean uniformity to the lateral growth amount between the neighboring cells. To form the plug pad 29 having the same amount of lateral growth thickness, the following method is applied in this embodiment of the present invention.

In the first place, after the plug pad 29 is formed, in-situ annealing may be performed in the ambient of $H_2$. Through the in-situ annealing performed in the ambient of $H_2$, silicon migration may occur. Silicon migration may contribute to lateral dimension uniformity by inducing all the plug pads 29 to the lowest energy state.

Secondly, facet is forced to be formed by optimizing the growth conditions of the plug pad 29.

Figure 6:
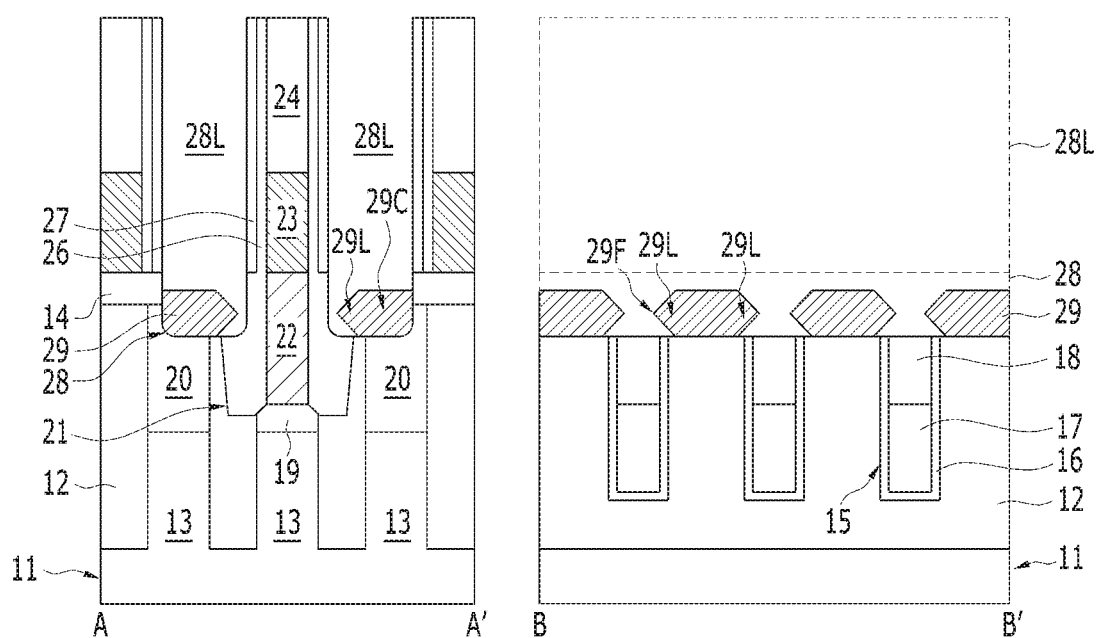
FIG. 6 is a cross-sectional view of a facet of a plug pad.

FIG. 6 is a cross-sectional view of a facet of a plug pad. Epitaxy facet may be formed due to a growth rate difference between growth planes at a predetermined angle, improving lateral dimension uniformity very much. When the growth temperature is decreased and HCl is implanted excessively and the mixed gas of $SiH_4$ and DCS is used, the growth rate difference between growth planes may become greater so as to form the plug pad 29 having a facet 29F shown in FIG. 6.

By controlling the selectivity and the lateral growth as described above, the lateral dimension of the plug pad 29 may be controlled. The plug pad 29 may be formed to have an oval shape or a spherical shape through silicon migration. The facet 29F may be formed in a hexagonal shape by using the mixed gas of $SiH_4$ and DCS and performing the process at a low temperature of approximately 550° C. to approximately 650° C.

In addition, the plug pad 29 may be formed of SEG-Si or SEG-SiP. When the plug pad 29 is formed of SEG-SiP, contact resistance with a silicon active region may be improved. The SEG-SiP may be formed by co-flowing a phosphine ($PH_3$) gas during the selective epitaxial growth process.

A method for forming SEG-SiP as the plug pad 29 is as follows. The SEG-SiP may be formed using a phosphorus (P)-containing gas, a silicon (Si)-containing gas, and a chlorine (Cl)-containing gas. The chlorine (Cl)-containing gas may include hydrogen chloride (HCl). The phosphorus (P)-containing gas and the silicon (Si)-containing gas may be referred to as a phosphorus (P)-containing precursor and the silicon (Si)-containing precursor, respectively. The phosphorus (P)-containing gas may include phosphine ($PH_3$). The silicon (Si)-containing gas may include silane ($SiH_4$), disilane ($Si_2H_6$), trisilane ($Si_3H_8$), dichlorosilane ($SiH_2Cl_2$, DCS), or a combination thereof. In this embodiment of the present invention, the SEG-SiP may be formed by mixing dichlorosilane ($SiH_2Cl_2$, DCS) and silane ($SiH_4$). The selective epitaxial growth process may hardly secure selectivity with respect to an insulating material. Therefore, in this embodiment of the present invention, the selective epitaxial growth process may be performed by using a mixture of dichlorosilane ($SiH_2Cl_2$, DCS) and silane ($SiH_4$) in order to secure selectivity with respect to an insulating material. For this reason, chlorine (Cl) functional groups may be removed from the surface of the epitaxially grown structure and the growth rate may be raised due to acceleration of adsorption. When the dichlorosilane ($SiH_2Cl_2$, DCS) and silane ($SiH_4$) are mixed, phosphorus doping level of the SEG-SiP may be increased.

The process of forming the SEG-SiP may include an in-situ doping process. For example, the in-situ doping process may be performed by co-flowing phosphine ($PH_3$) while a silicon epitaxial layer is deposited.

As described above, the SEG-SiP may be formed by using silane ($SiH_4$), dichlorosilane ($SiH_2Cl_2$, DCS), hydrogen chloride (HCl) and phosphine ($PH_3$) at a low temperature ranging from approximately 550° C. to approximately 650° C.

Figure 5K:
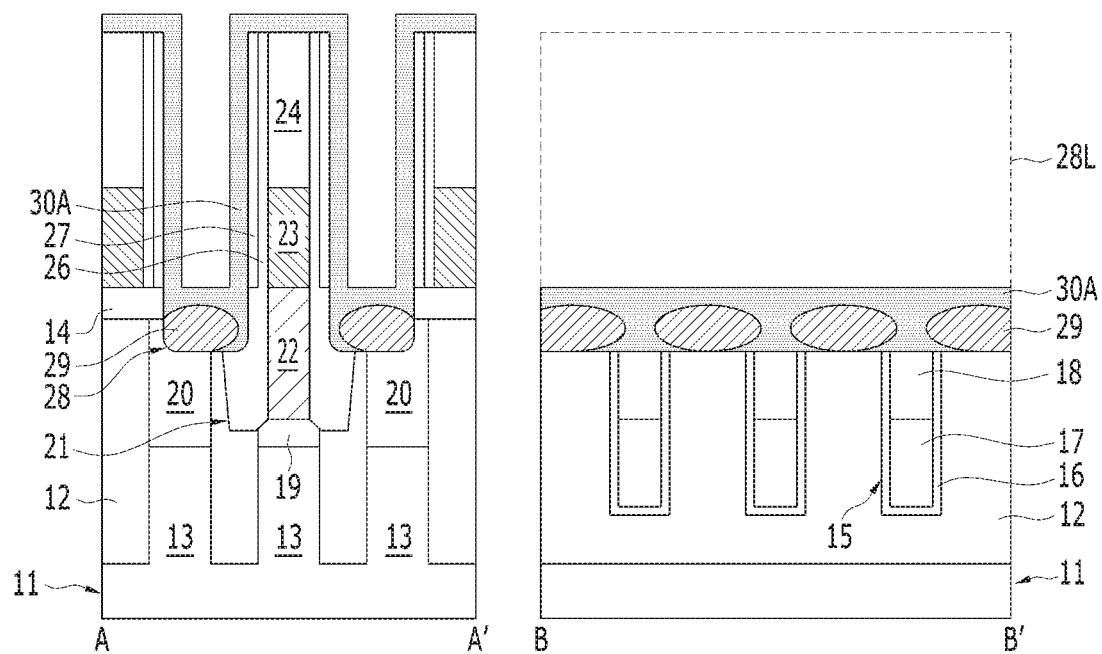

Referring to FIGS. 4K and 5K, a second spacer 30A may be formed. The second spacer 30A may cover the plug pad 29. The second spacer 30A may also cover the first spacer 27. The second spacer 30A may cover the lower portion of the bit line spacer 26. The second spacer 30A may fill the space between the lower portion of the bit line spacer 26 and the plug pad 29. The second spacer 30A may fill the space between the sealing layer 18 AND THE plug pad 29.

The second spacer 30A may be formed of an insulating material such as a silicon oxide or a silicon nitride or combinations thereof. The first spacer 27 and the second spacer 30A may be formed of the same material.

Since the second spacer 30A is formed after the plug pad 29 is formed, there is no limitation in the thickness of the second spacer 30A. For example, the second spacer 30A may be formed as thick as possible.

Figure 5L:
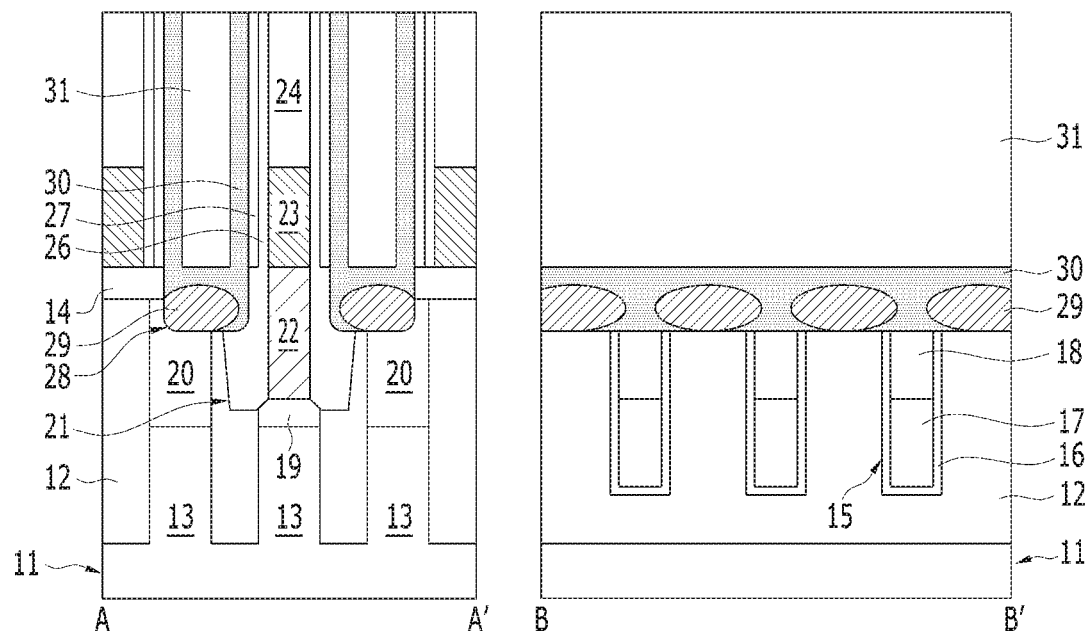

Referring to FIGS. 4L and 5L, a sacrificial layer 31 may be formed. The sacrificial layer 31 may gap-fill the space between the bit line structures over the second spacer 30A. The sacrificial layer 31 may be formed of a silicon oxide. The sacrificial layer 31 may include a Spin-On-Dielectric (SOD) material. Subsequently, the sacrificial layer 31 may be planarizied to expose the upper portion of the bit line structures. As a result, the sacrificial layer 31 may be positioned between the bit line structures. From the perspective of a top view, the sacrificial layer 31 may be in parallel to the bit line structures. After the sacrificial layer 31 is planarizied, the second spacer 30A may be planarizied to expose the upper surface of the bit line hard mask layer 24. Hereafter, the second spacer 30A remaining after the planarization process may be referred to as a second spacer 30. The second spacer 30 may cover the upper portion of the plug pad 29.

Figure 5M:
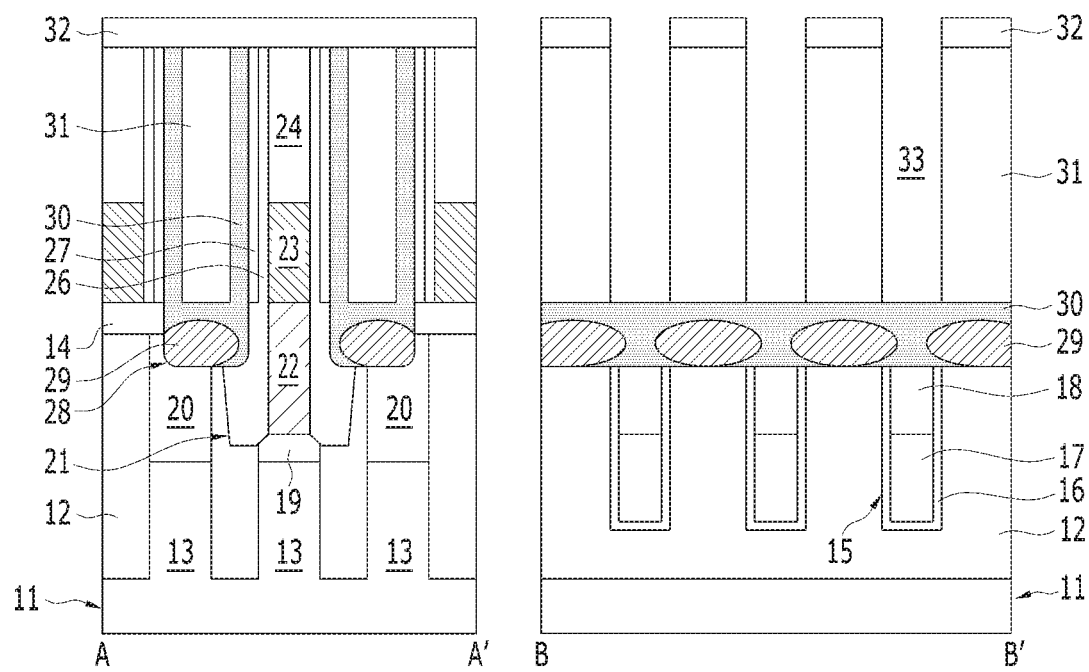

Referring to FIGS. 4M and 5M, a plug isolation mask layer 32 may be formed over the sacrificial layer 31. The plug isolation mask layer 32 may include a photoresist. The plug isolation mask layer 32 may be formed of a material having an etch selectivity with respect to the sacrificial layer 31.

The sacrificial layer 31 may be etched by using the plug isolation mask layer 32 as an etch barrier. As a result, a plug isolation portion 33 may be formed.

Figure 5N:
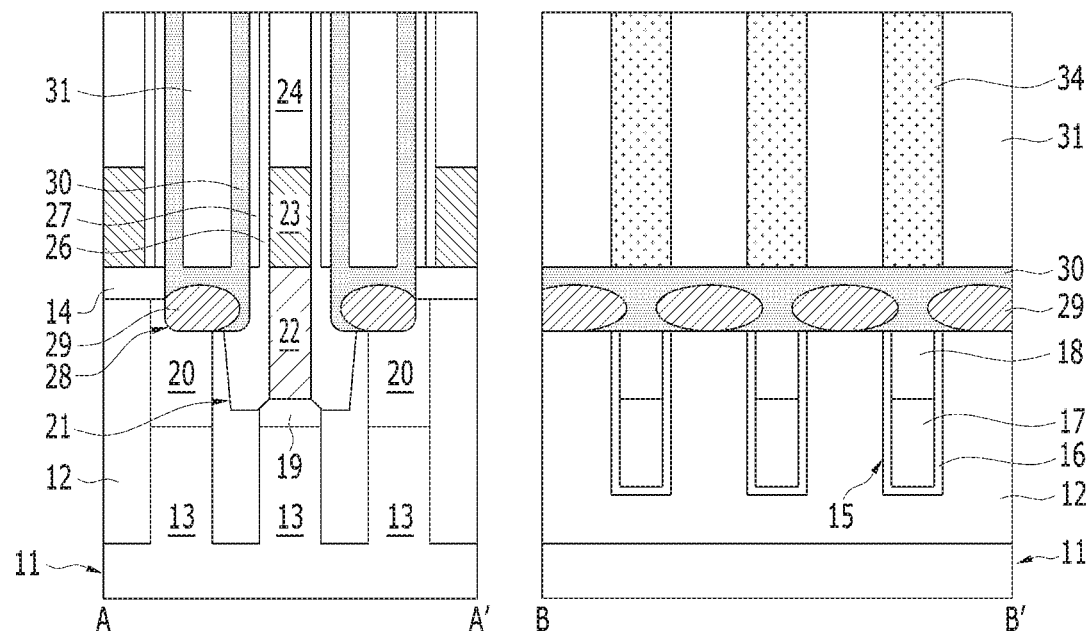

Referring to FIGS. 4N and 5N, after the plug isolation mask layer 32 is removed, a plug isolation layer 34 may be formed in the inside of the plug isolation portion 33. The plug isolation layer 34 may be formed by depositing an insulating material and then performing a planarization process. The plug isolation layer 34 may be formed of a silicon nitride.

Figure 5O:
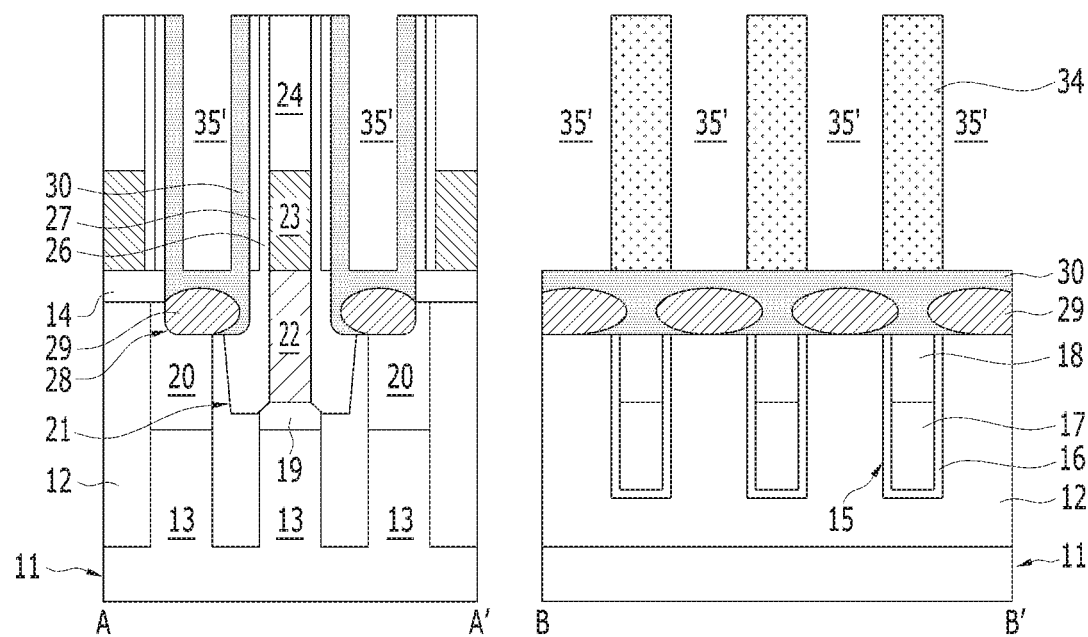

Referring to FIGS. 4O and 5O, after the plug isolation layer 34 is formed, the remaining sacrificial layer 31 may be removed. As a result, a second contact hole 35' may be formed. The second contact hole 35' may be formed between the bit line structures. The second contact hole 35' may be called a storage node contact hole.

As described above, the second contact hole 35' may be formed by depositing the sacrificial layer 31, forming the plug isolation portion 33, forming the plug isolation layer 34, and removing the sacrificial layer 31 sequentially. The series of the processes may be called 'a Damascene process'. In short, the second contact hole 35' may be formed through the Damascene process.

From the perspective of a plane view, the second contact hole 35' may have a rectangular shape. The size of the second contact hole 35' may be decided by the second spacer 30 and the plug isolation layer 34. The second spacer 30 and the plug isolation layer 34 may be collectively called 'a plug isolation structure'. The second contact hole 35' may be defined in the plug isolation structure.

After the sacrificial layer 31 is removed, the second spacer 30 under the second contact hole 35' may be exposed.

Figure 5P:
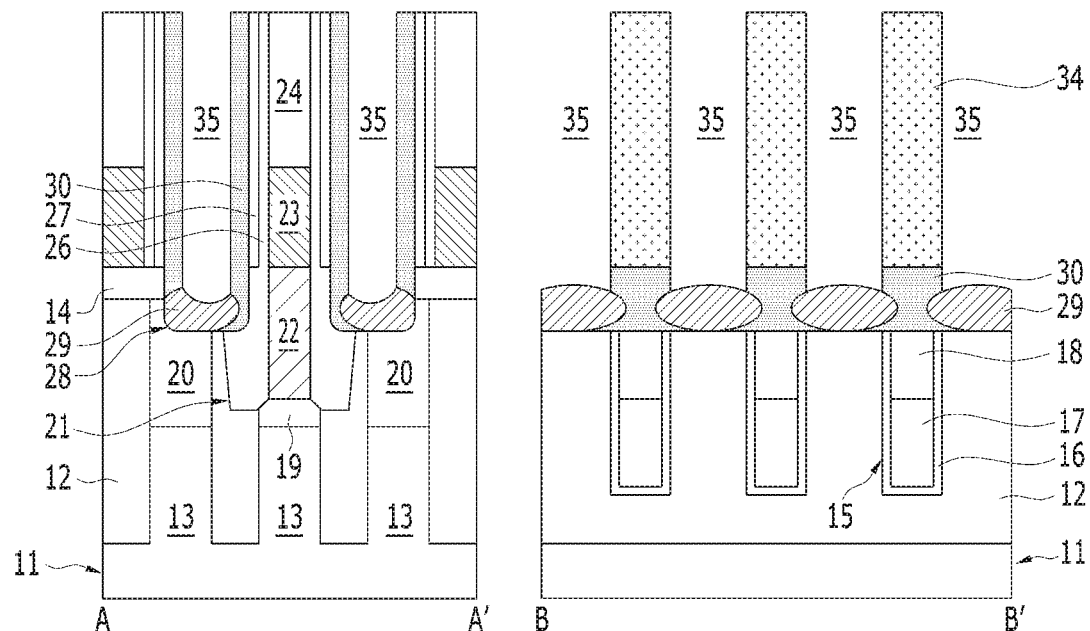
Figure 5Q:
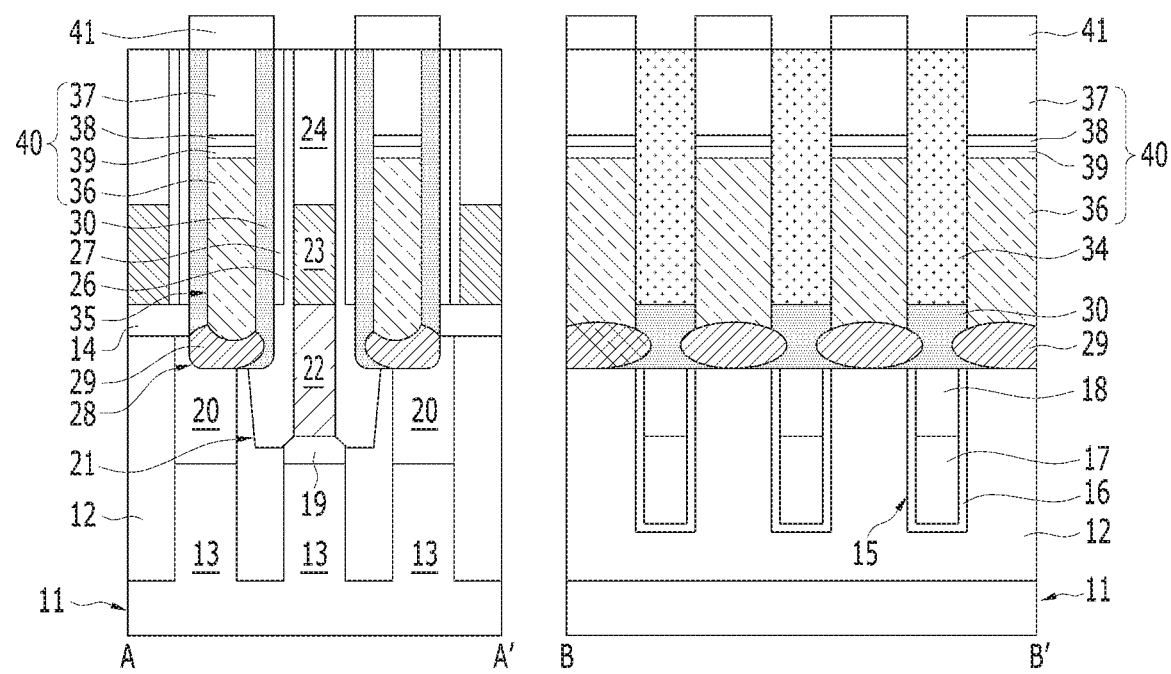

Referring to FIGS. 4P and 5P, the bottom portion of the second contact hole 35' may be extended. In other words, the second spacer 30 under the second contact hole 35' may be etched. As a result, an extended second contact hole 35 may be formed, and the plug pad 29 in the bottom surface of the second contact hole 35 may be exposed. As described above, the series of processes of exposing the plug pad 29 may be referred to as an open etch process of the second contact hole 35.

When the second spacer 30 is etched, the surface of the upper portion of the plug pad 29 may be recessed to a predetermined depth. The landing area of the second contact hole 35 may be smaller than the surface area of the upper portion of the plug pad 29.

As described above, the second contact hole 35 may land on the plug pad 29. For example, although the second spacer 30 is thick, the open etch process of the second contact hole 35 is performed over the plug pad 29. Herein, although overlay misalignment may occur, not-opening of the second contact hole 35 may not occur due to the lateral margin secured by the plug pad 29.

When a contact plug 40 (see FIG. 5Q) is formed in the second contact hole 35 having the sufficient open margin, the plug pad 29 may function as a landing pad so as to connect the contact plug 40 and the active region 13 to each other.

Referring to FIGS. 4Q and 5Q, the second contact hole 35 may be filled with the contact plug 40. The contact plug 40 may include a first plug 36 and a second plug 37. The first plug 36 may contact the plug pad 29, and the second plug 37 may be formed over the first plug 36. The first plug 36 may be formed of a silicon-containing material or a metal material. The second plug 37 may be formed of a metal material. The first plug 36 may include polysilicon. The second plug 37 may include tungsten. The first plug 36 may be formed by depositing a polysilicon layer to fill the contact hole 35 and performing a recessing process. The first plug 36 may be recessed to be lower than the upper surface of the bit line hard mask layer 24. The second plug 37 may be formed by depositing a metal material to fill the second contact hole 35 where the first plug 36 is formed and then performing a recessing process. The upper surfaces of the second plug 37 and the bit line hard mask layer 24 may be at the same level. The second plug 37 may include a material having a lower resistance than that of the first plug 36. The second plug 37 may include titanium, a titanium nitride, tungsten, or a combination thereof. For example, the second plug 37 may have a stacked structure (TiN/W) where tungsten is stacked over a titanium nitride.

An ohmic contact 38 may be further formed between the first plug 36 and the second plug 37. The ohmic contact 38 may be formed of a metal silicide. The ohmic contact 38 may include a cobalt silicide, a titanium silicide, or a nickel silicide. The ohmic contact 38 may decrease the contact resistance.

An interface doping layer 39 may be further formed between the first plug 36 and the second plug 37. The interface doping layer 39 may be positioned between the ohmic contact 38 and the first plug 36. The interface doping layer 39 may be formed by doping the upper region of the first plug 36 with an impurity. The interface doping layer 39 may be doped with phosphorus (P). The first plug 36 and the interface doping layer 39 may be doped with the same dopant. The dopant concentrations of the first plug 36 and the interface doping layer 39 may be different from each other. The dopant concentration of the interface doping layer 39 may be higher than the dopant concentration of the first plug 36. The interface doping layer 39 may also decrease the contact resistance.

The contact plug 40 may be called a storage node contact plug. When the contact plug 40 is formed over the plug pad 29 in the fabrication of a DRAM of approximately 10 nm or less, connection failure between the storage node contact plugs may be minimized.

Subsequently, a memory element 41 including a capacitor may be formed over the second plug 37.

According to the embodiment of the present invention described above, the active region 13 and the contact plug 40 are coupled to each other through the plug pad 29 that is formed through the selective epitaxial growth process. The line-type opening 28L and the recess 28 may be formed in the region to be coupled to the contact plug before the formation of the second spacer 30, and the plug pad 29 may be formed in the recess 28 by performing the selective epitaxial growth process. Due to the plug pad 29 that is formed through the selective epitaxial growth process, margin for the contact plug 40 to land may be secured sufficiently in the process of forming the second contact hole 35 that is performed after the second spacer 30 is formed. In this way, it is possible to prevent a not-open phenomenon of the second contact hole 35.

Also, since the plug pad 29 is formed before the second spacer 30 becomes thick, the thickness margin for the second spacer 30 may be secured. In this way, it is possible to secure margins for the thickness of the plug isolation mask layer 32 and the etch selectivity and etch profile of the second contact hole 35 during the process of forming the plug isolation layer 34 and the process of forming the second contact hole 35.

Also, when the plug pad 29 is used, there is no limitation in the minimal thickness of the active region 13, it is possible to secure margin for the processes of forming the isolation layer 12 and a fin region. Consequently, the problem of loss in the active region that may be caused by an oxidation may be solved.

Also, within the lateral growth dimensions of the plug pad 29, the contact plug 40 may be able to land regardless of overlay misalignment. Therefore, overlay margin for photolithography may be secured as well.

In addition, when the SEG-SiP is used for the plug pad 29, the contact resistance with the active region 13 may be improved, which may lead to improved electrical characteristics of a semiconductor device.

The semiconductor device in accordance with the above-described embodiments of the present invention may be applied not only to a Dynamic Random Access Memory (DRAM) but also to a Static Random Access Memory (SRAM), a flash memory, a Ferroelectric Random Access Memory (FeRAM), a Magnetic Random Access Memory (MRAM), a Phase-change Random Access Memory (PRAM) and the like.

According to the embodiments of the present invention, it is possible to easily form a contact hole of a high aspect ratio by forming a plug pad using a Selective Epitaxial Growth (SEG) process before the formation of a contact plug.

According to the embodiments of the present invention, since a plug pad is formed through the SEG process, the contact area between the plug pad and an active region may be increased so as to decrease the contact resistance.

According to the embodiments of the present invention, since a plug pad is formed in advance, the overlay margin of a contact hole may be improved.

Consequently, the electrical characteristics of a semiconductor device may be improved.

While the present invention has been described with respect to specific embodiments, it will be apparent to those skilled in the art that various changes and modifications may be made without departing from the spirit and scope of the invention as defined in the following claims.

What is claimed is:
1. A semiconductor device, comprising:
a semiconductor substrate including an active region and an isolation layer;
a plurality of bit lines over the semiconductor substrate;
a line-type opening that is formed between the bit lines and includes a recess which exposes the active region and the isolation layer;
a silicon-containing pad selectively grown on the exposed active region;

a plug isolation structure that is formed inside the line-type opening to expose the silicon-containing pad and defines a contact hole having a smaller landing area than a surface area of an upper portion of the silicon-containing pad; and a silicon-containing plug formed on the silicon-containing pad inside the contact hole, wherein the silicon-containing pad comprising:

a central portion formed on the active region; and a side extended portion that laterally grows up from the central portion to extend over the isolation layer.

2. The semiconductor device of claim 1, wherein the silicon-containing pad includes a selective epitaxial layer.

3. The semiconductor device of claim 1, wherein the silicon-containing pad includes a SEG-Si, SEG-SiGe, SEG-SiC or SEG-SiP.

4. The semiconductor device of claim 1, wherein the plug isolation structure includes:

a spacer that is formed on both side walls of the line-type opening; and a plug isolation layer that is formed inside the line-type opening where the spacer is formed, and the contact hole is defined by being self-aligned to the plug isolation layer and the spacer.

5. The semiconductor device of claim 1, further comprising:

a word line buried in the semiconductor substrate;

first and second source/drain regions that are formed in the semiconductor substrate on both sides of the word line;

a bit line contact plug formed on the first source/drain region; and a bit line formed on the bit line contact plug, wherein the silicon-containing pad is coupled to the second source/drain region.

6. The semiconductor device of claim 1, further comprising:

an ohmic contact layer on the silicon-containing plug;

a metal plug on the ohmic contact layer; and a memory element formed over the metal plug.

7. The semiconductor device of claim 6, further comprising:

an interface doping layer positioned between the ohmic contact layer and the silicon-containing plug.

8. The semiconductor device of claim 7, wherein the interface doping layer and the silicon-containing plug include the same dopant.

9. The semiconductor device of claim 1, wherein the silicon-containing plug includes poly silicon.

* * * * *